US012690476B2

(12) United States Patent
Kuo et al.

(10) Patent No.: US 12,690,476 B2
(45) Date of Patent: Jul. 21, 2026

(54) SEMICONDUCTOR DEVICE PACKAGE AND METHODS OF FORMATION

(71) Applicant: Taiwan Semiconductor Manufacturing Company, Ltd., Hsinchu (TW)

(72) Inventors: Ting-Ting Kuo, Hsinchu City (TW); Li-Hsien Huang, Zhubei City (TW); Tien-Chung Yang, Hsinchu City (TW); Yao-Chun Chuang, Hsinchu City (TW); Yinlung Lu, Hsinchu (TW); Jun He, Zhubei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 818 days.

(21) Appl. No.: 17/816,261

(22) Filed: Jul. 29, 2022

(65) Prior Publication Data

US 2024/0038649 A1 Feb. 1, 2024

(51) Int. Cl.
H10W 70/65 (2026.01)
H10W 70/05 (2026.01)
(Continued)

(52) U.S. Cl.
CPC ......... H10W 70/65 (2026.01); H10W 70/095 (2026.01); H10W 70/69 (2026.01);
(Continued)

(58) Field of Classification Search
CPC ............. H01L 23/49838; H01L 21/486; H01L 23/145; H01L 23/49894; H01L 24/08;

H01L 24/16; H01L 24/32; H01L 24/73; H01L 25/162; H01L 23/49816; H01L 23/49833; H01L 2224/08235; H01L 2224/16235; H01L 2224/32225; H01L 2224/73204; H01L 2924/182; H01L 2924/183; H01L 2924/186; H01L 2924/30101; H01L 2924/3511;
(Continued)

(56) References Cited

U.S. PATENT DOCUMENTS 10,269,587 B2 * 4/2019 Lin ......................... H10P 54/00
10,770,416 B2 9/2020 Kim et al.
(Continued)

FOREIGN PATENT DOCUMENTS

TW 202010062 A 3/2020
TW 202205594 A 2/2022

*Primary Examiner* — Raj R Gupta
(74) *Attorney, Agent, or Firm* — Harrity & Harrity, LLP

(57) ABSTRACT

An adhesion layer may be formed over portions of a redistribution layer (RDL) in a redistribution structure of a semiconductor device package. The portions of the RDL over which the adhesion layer is formed may be located in the "shadow" of (e.g., the areas under and/or over and within the perimeter of) one or more through insulator layers (TIVs) that are connected with the redistribution layer structure. The adhesion layer, along with a seed layer on which the portions of the RDL are formed, encapsulate the portions of the RDL in the shadow of the one or more TIVs, which promotes and/or increases adhesion between the portions of the RDL and the polymer layers of the redistribution structure.

20 Claims, 42 Drawing Sheets

(51) Int. Cl.

| | |
|---|---|
| *H10W 70/69* | (2026.01) |
| *H10W 70/695* | (2026.01) |
| *H10W 74/00* | (2026.01) |
| *H10W 74/10* | (2026.01) |
| *H10W 74/15* | (2026.01) |
| *H10W 74/40* | (2026.01) |
| *H10W 90/00* | (2026.01) |

(52) U.S. Cl.
CPC ......... *H10W 70/695* (2026.01); *H10W 90/00* (2026.01); *H10W 74/00* (2026.01); *H10W 74/127* (2026.01); *H10W 74/15* (2026.01); *H10W 74/40* (2026.01); *H10W 90/401* (2026.01); *H10W 90/701* (2026.01); *H10W 90/724* (2026.01); *H10W 90/734* (2026.01); *H10W 90/794* (2026.01)

(58) Field of Classification Search
CPC ..... H01L 2924/35121; H01L 2924/364; H01L 2924/37001; H01L 21/6835; H01L 21/4857; H01L 23/5389; H01L 25/0657; H01L 2221/68331; H01L 2221/68345; H01L 2221/68359; H01L 2221/68368; H01L 2225/06513; H01L 2225/06517; H01L 2225/06524; H01L 2225/06548; H01L 2225/1023; H01L 2225/1035; H01L 2225/1041; H01L 25/50; H01L 23/562; H01L 25/105; H10W 70/095; H10W 70/60; H10W 70/614; H10W 70/65; H10W 72/823; H10W 72/851; H10W 74/15; H10W 90/20; H10W 90/401; H10W 90/701; H10W 90/722; H10W 90/724; H10W 90/734; H10W 90/794

See application file for complete search history.

(56) References Cited

U.S. PATENT DOCUMENTS

| | | | | |
|---|---|---|---|---|
| 10,867,932 | B2 * | 12/2020 | Tsai | H10W 70/614 |
| 11,177,425 | B2 * | 11/2021 | Li | H10H 20/857 |
| 11,538,783 | B2 | 12/2022 | Jin et al. | |
| 2016/0240480 | A1 * | 8/2016 | Lin | H01L 21/76885 |
| 2017/0040269 | A1 | 2/2017 | Lu et al. | |
| 2021/0305189 | A1 * | 9/2021 | Jin | H01L 24/14 |

* cited by examiner

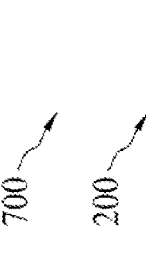
702
FIG. 7A

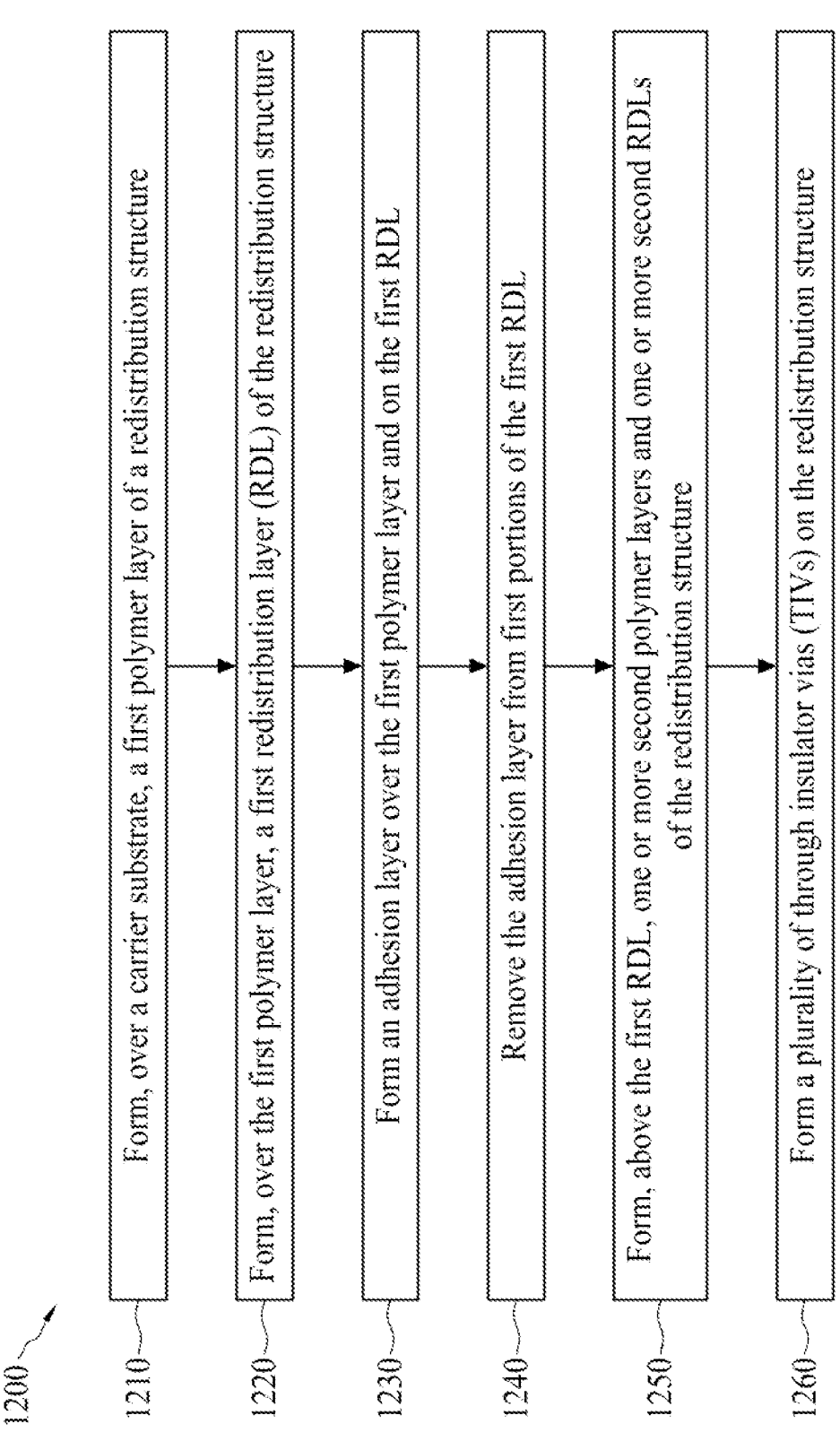

1200

1210 — Form, over a carrier substrate, a first polymer layer of a redistribution structure 1220 — Form, over the first polymer layer, a first redistribution layer (RDL) of the redistribution structure 1230 — Form an adhesion layer over the first polymer layer and on the first RDL 1240 — Remove the adhesion layer from first portions of the first RDL 1250 — Form, above the first RDL, one or more second polymer layers and one or more second RDLs of the redistribution structure 1260 — Form a plurality of through insulator vias (TIVs) on the redistribution structure

FIG. 12

SEMICONDUCTOR DEVICE PACKAGE AND METHODS OF FORMATION

BACKGROUND

Various semiconductor device packing techniques may be used to incorporate one or more semiconductor dies into a semiconductor device package. In some cases, semiconductor dies may be stacked in a semiconductor device package to achieve a smaller horizontal or lateral footprint of the semiconductor device package and/or to increase the density of the semiconductor device package. Semiconductor device packing techniques that may be performed to stack semiconductor dies in a semiconductor device package may include package on package (PoP), chip on wafer (CoW), wafer on wafer (WoW), and/or chip on wafer on substrate (CoWoS), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7I are diagrams of an example implementation described herein.

FIG. 12 is a flowchart of an example process associated with forming a semiconductor device package.

DETAILED DESCRIPTION

Figure 1:
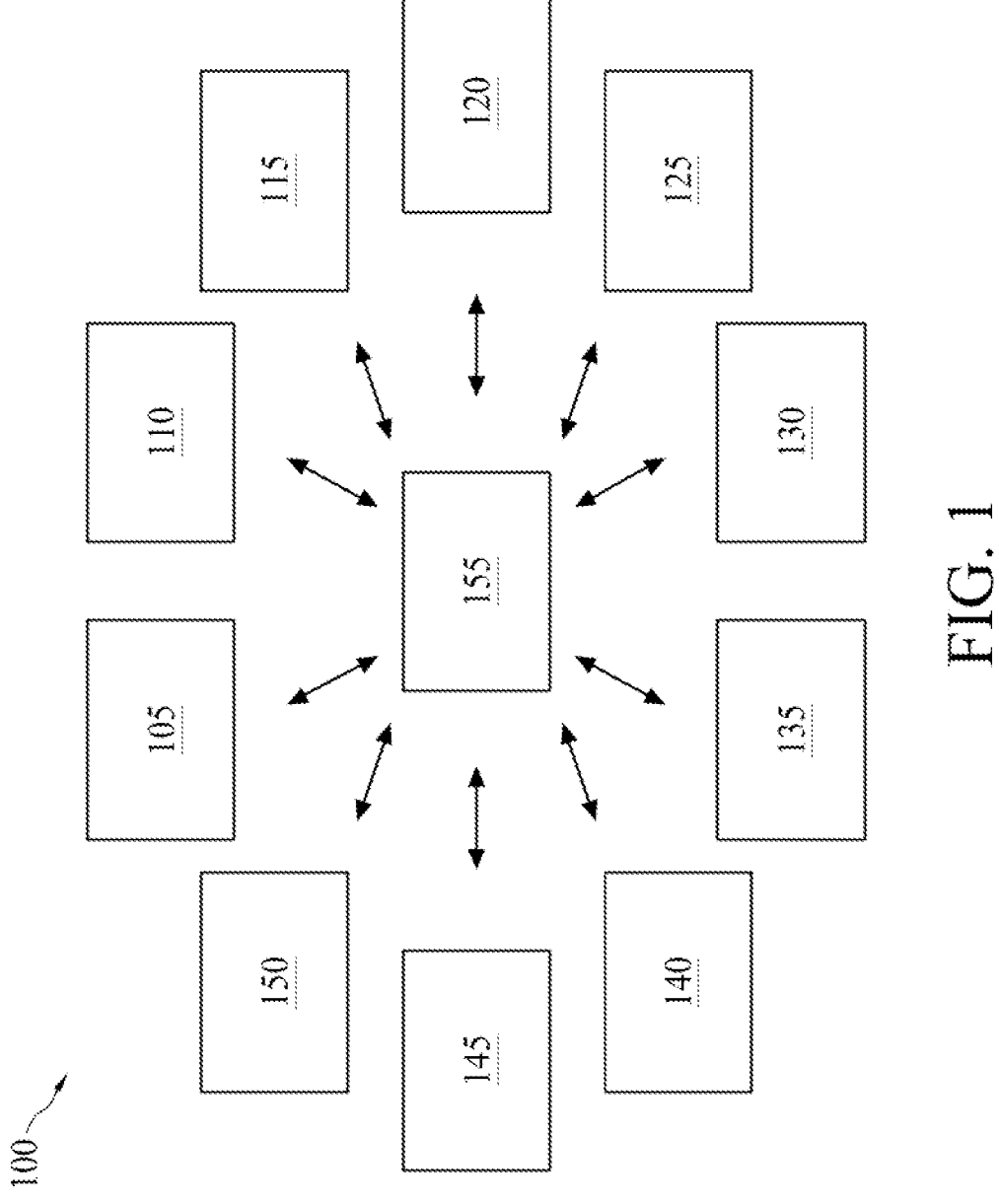
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A redistribution structure, such as a backside redistribution structure of a semiconductor device package, may include a plurality of redistribution layers (RDLs) that are embedded in a plurality of polymer layers (PMs). In some cases, delamination can occur between a polymer layer and an RDL in a redistribution structure. Delamination can occur, for example, due to thermal expansion that is caused by one or more semiconductor processing operations that are performed after the redistribution structure is formed. For example, thermal expansion of a through insulator layer via (TIV) can result from high temperatures in a ball grid array (BGA) ball mounting reflow operation for the semiconductor device package. The thermal expansion of the TIV can cause physical stress to be transferred to RDL(s) in the redistribution structure that are located in the "shadow" of the TIV. The shadow of a TIV, as used herein, refers to the areas above and below the TIV that are within the perimeter of the TIV.

The physical stress that is transferred to the redistribution structure in the shadow of the TIV may cause delamination between the RDL(s) and polymer layer(s) under the TIV. The delamination may result in an increased risk of electrical shorting and failures in the redistribution structure. For example, the delamination may propagate between two or more RDLs that are at different electrical potentials (e.g., $V_{CC}$ and ground), which may result in electrical shorting along the delamination between the RDLs. This may result in failures in the redistribution structure, which may cause the semiconductor device package to fail and may reduce semiconductor device package yield.

Some implementations described herein provide redistribution layer structure formation techniques that may reduce the likelihood of cracking and delamination in a redistribution layer structure. As described herein, an adhesion layer may be formed over portions of an RDL in a redistribution structure of a semiconductor device package. The portions of the RDL over which the adhesion layer is formed may be located in the shadow of (e.g., under and/or over) one or more TIVs that are connected with the redistribution layer structure. The adhesion layer, along with a seed layer on which the portions of the RDL are formed, encapsulate the portions of the RDL in the shadow of the one or more TIVs, which promotes and/or increases adhesion between the portions of the RDL and the polymer layers of the redistribution structure.

The increased adhesion reduces the likelihood of delamination between the RDL and the polymer layers of the redistribution structure that might otherwise occur from physical stress being transferred to the RDL due to thermal expansion of the one or more TIVs. This may reduce the likelihood of electrical shorting in the redistribution structure, which may reduce the likelihood of failures in the semiconductor device package and may increase semiconductor device package yield, among other examples.

FIG. 1 is a diagram of an example environment 100 in which systems and/or methods described herein may be implemented. As shown in FIG. 1, environment 100 may include a plurality of semiconductor processing tool sets 105-150 and a transport tool set 155. The plurality of semiconductor processing tool sets 105-150 may include a redistribution layer (RDL) tool set 105, a planarization tool set 110, an connection tool set 115, an automated test equipment (ATE) tool set 120, a singulation tool set 125, a die-attach tool set 130, an encapsulation tool set 135, a printed circuit board (PCB) tool set 140, a surface mount (SMT) tool set 145, and a finished goods tool set 150. The semiconductor processing tool sets 105-150 of example environment 100 may be included in one or more facilities, such as a semiconductor clean or semi-clean room, a semiconductor foundry, a semiconductor processing facility, an outsourced assembly and test (OSAT) facility, and/or a manufacturing facility, among other examples.

In some implementations, the semiconductor processing tool sets 105-150, and operations performed by the semiconductor processing tool sets 105-150, are distributed across multiple facilities. Additionally, or alternatively, one or more of the semiconductor processing tool sets 105-150 may be subdivided across the multiple facilities. Sequences of operations performed by the semiconductor processing tool sets 105-150 may vary based on a type of the semiconductor package or a state of completion of the semiconductor package.

One or more of the semiconductor processing tool sets 105-150 may perform a combination of operations to assemble a semiconductor package (e.g., attach one or more IC dies to a substrate, where the substrate provides an external connectivity to a computing device, among other examples). Additionally, or alternatively, one or more of the semiconductor processing tool sets 105-150 may perform a combination of operations to ensure a quality and/or a reliability of the semiconductor package (e.g., test and sort the one or more IC dies, and/or the semiconductor package, at various stages of manufacturing).

The semiconductor package may correspond to a type of semiconductor package. For example, the semiconductor package may correspond to a flipchip (FC) type of semiconductor package, a ball grid array (BGA) type of semiconductor package, a multi-chip package (MCP) type of semiconductor package, or a chip scale package (CSP) type of semiconductor package. Additionally, or alternatively, the semiconductor package may correspond to a plastic leadless chip carrier (PLCC) type of semiconductor package, a system-in-package (SIP) type of semiconductor package, a ceramic leadless chip carrier (CLCC) type of semiconductor package, or a thin small outline package (TSOP) type of semiconductor package, among other examples.

The RDL tool set 105 includes one or more tools capable of forming one or more layers and patterns of materials (e.g., dielectric layers, conductive redistribution layers, and/or vertical connection access structures (vias), among other examples) on a semiconductor substrate (e.g., a semiconductor wafer, among other examples). The RDL tool set 105 may include a combination of one or more photolithography tools (e.g., a photolithography exposure tool, a photoresist dispense tool, a photoresist develop tool, among other examples), a combination of one or more etch tools (e.g., a plasma-based etched tool, a dry-etch tool, or a wet-etch tool, among other examples), and one or more deposition tools (e.g., a chemical vapor deposition (CVD) tool, a physical vapor deposition (PVD) tool, an atomic layer deposition (ALD) tool, or a plating tool, among other examples). In some implementations, the example environment 100 includes a plurality of types of such tools as part of RDL tool set 105.

The planarization tool set 110 includes one or more tools that are capable of polishing or planarizing various layers of the semiconductor substrate (e.g., the semiconductor wafer). The planarization tool set 110 may also include tools capable of thinning the semiconductor substrate. The planarization tool set 110 may include a chemical mechanical planarization (CMP) tool or a lapping tool, among other examples. In some implementations, the example environment 100 includes a plurality of types of such tools as part of the planarization tool set 110.

The connection tool set 115 includes one or more tools that are capable of forming connection structures (e.g., electrically-conductive structures) as part of the semiconductor package. The connection structures formed by the connection tool set 115 may include a wire, a stud, a pillar, a bump, or a solderball, among other examples. The connection structures formed by the connection tool set 115 may include materials such as a gold (Au) material, a copper (Cu) material, a silver (Ag) material, a nickel (Ni) material, a tin (Sn) material, or a palladium (Pd) material, among other examples. The connection tool set 115 may include a bumping tool, a wirebond tool, or a plating tool, among other examples. In some implementations, the example environment 100 includes a plurality of types of such tools as part of the connection tool set 115.

The ATE tool set 120 includes one or more tools that are capable of testing a quality and a reliability of the one or more IC dies and/or the semiconductor package (e.g., the one or more IC dies after encapsulation). The ATE tool set 120 may perform wafer testing operations, known good die (KGD) testing operations, semiconductor package testing operations, or system-level (e.g., a circuit board populated with one or more semiconductor packages and/or one or more IC dies) testing operations, among other examples. The ATE tool set 120 may include a parametric tester tool, a speed tester tool, and/or a burn-in tool, among other examples. Additionally, or alternatively, the ATE tool set 120 may include a prober tool, probe card tooling, test interface tooling, test socket tooling, a test handler tool, burn-in board tooling, and/or a burn-in board loader/unloader tool, among other examples. In some implementations, the example environment 100 includes a plurality of types of such tools as part of the ATE tool set 120.

The singulation tool set 125 includes one or more tools that are capable of singulating (e.g., separating, removing) the one or more IC dies or the semiconductor package from a carrier. For example, the singulation tool set 125 may include a dicing tool, a sawing tool, or a laser tool that cuts the one or more IC dies from the semiconductor substrate. Additionally, or alternatively, the singulation tool set 125 may include a trim-and-form tool that excises the semiconductor package from a leadframe. Additionally, or alternatively, the singulation tool set 125 may include a router tool or a laser tool that removes the semiconductor package from a strip or a panel of an organic substrate material, among other examples. In some implementations, the example environment 100 includes a plurality of types of such tools as part of the singulation tool set 125.

The die-attach tool set 130 includes one or more tools that are capable of attaching the one or more IC dies to the interposer, the leadframe, and/or the strip of the organic substrate material, among other examples. The die-attach tool set 130 may include a pick-and-place tool, a taping tool, a reflow tool (e.g., a furnace), a soldering tool, or an epoxy dispense tool, among other examples. In some implementations, the example environment 100 includes a plurality of types of such tools as part of the die-attach tool set 130.

The encapsulation tool set 135 includes one or more tools that are capable of encapsulating the one or more IC dies (e.g., the one or more IC dies attached to the interposer, the leadframe, or the strip of organic substrate material). For example, the encapsulation tool set 135 may include a molding tool that encapsulates the one or more IC dies in a plastic molding compound. Additionally, or alternatively, the encapsulation tool set 135 may include a dispense tool that dispenses an epoxy polymer underfill material between the one or more IC dies and an underlying surface (e.g., the interposer or the strip of organic substrate material, among other examples). In some implementations, the example environment 100 includes a plurality of types of such tools as part of the encapsulation tool set 135.

The PCB tool set 140 incudes one or more tools that are capable of forming a PCB having one or more layers of electrically-conductive traces. The PCB tool set 140 may form a type of PCB, such as a single layer PCB, a multi-layer PCB, or a high density connection (HDI) PCB, among other examples. In some implementations, the PCB tool set 140 forms the interposer and/or the substrate using one or more layers of a buildup film material and/or fiberglass reinforced epoxy material. The PCB tool set 140 may include a laminating tool, a plating tool, a photoengraving tool, a laser cutting tool, a pick-and-place tool, an etching tool, a dispense tool, a bonding tool, and/or a curing tool (e.g., a furnace) among other examples. In some implementations, the example environment 100 includes a plurality of types of such tools as part of the PCB tool set 140.

The SMT tool set 145 includes one or more tools that are capable of mounting the semiconductor package to a circuit board (e.g., a central processing unit (CPU) PCB, a memory module PCB, an automotive circuit board, and/or a display system board, among other examples). The SMT tool set 145 may include a stencil tool, a solder paste printing tool, a pick-and-place tool, a reflow tool (e.g., a furnace), and/or an inspection tool, among other examples. In some implementations, the example environment 100 includes a plurality of types of such tools as part of the SMT tool set 145.

The finished goods tool set 150 includes one or more tools that are capable of preparing a final product including the semiconductor package for shipment to a customer. The finished goods tool set 150 may include a tape-and-reel tool, a pick-and-place tool, a carrier tray stacking tool, a boxing tool, a drop-testing tool, a carousel tool, a controlled-environment storage tool, and/or a sealing tool, among other examples. In some implementations, the example environment 100 includes a plurality of types of such tools as part of the finished goods tool set 150.

The transport tool set 155 includes one or more tools that are capable of transporting work-in-process (WIP) between the semiconductor processing tools 105-150. The transport tool set 155 may be configured to accommodate one or more transport carriers such a wafer transport carrier (e.g., a wafer cassette or a front opening unified pod (FOUP), among other examples), a die carrier transport carrier (e.g., a film frame, among other examples), and/or a package transport carrier (e.g., a joint electron device engineering (JEDEC) tray or a carrier tape reel, among other examples). The transport tool set 155 may also be configured to transfer and/or combine WIP amongst transport carriers. The transport tool set 155 may include a pick-and-place tool, a conveyor tool, a robot arm tool, an overhead hoist transport (OHT) tool, an automated materially handling system (AMHS) tool, and/or another type of tool. In some implementations, the example environment 100 includes a plurality of types of such tools as part of the transport tool set 155.

One or more of the semiconductor processing tool sets 105-150 may perform one or more operations described herein. For example, one or more of the semiconductor processing tool sets 105-150 may perform one or more operations described in connection with FIGS. 6A-6J, 7A-7I, 8, 9A-9E, and/or 10A-10F, among other examples. As another example, one or more of the semiconductor processing tool sets 105-150 may form over a carrier substrate, a first polymer layer of a redistribution structure; may form, over the first polymer layer, a first redistribution layer (RDL) of the redistribution structure; may form an adhesion layer over the first polymer layer and on the first RDL; may remove the adhesion layer from first portions of the first RDL, where the adhesion layer remains on second portions of the first RDL; may form, above the first RDL, one or more second polymer layers and one or more second RDLs of the redistribution structure; and may form a plurality of through insulator vias (TIVs) on the redistribution structure, where the plurality of TIVs are connected to at least one of the one or more second RDLs.

As another example, one or more of the semiconductor processing tool sets 105-150 may form a seed layer on the first polymer layer; and/or may form the first RDL on the seed layer, where the adhesion layer and the seed layer encapsulate the second portions of the first RDL. As another example, one or more of the semiconductor processing tool sets 105-150 may form another seed layer on a portion of the adhesion layer of at least one of the second portions of the first RDL; and/or may form a via structure on the seed layer that is over the at least one of the second portions of the first RDL. As another example, one or more of the semiconductor processing tool sets 105-150 may remove a portion of the adhesion layer from at least one of the second portions of the first RDL to expose a portion of the at least one of the second portions of the first RDL; may form another seed layer on the exposed portion of the at least one of the second portions of the first RDL adhesion layer; and/or may form a via structure on the seed layer that is over the at least one of the second portions of the first RDL. As another example, one or more of the semiconductor processing tool sets 105-150 may form a polymer layer of the one or more polymer layers on the adhesion layer, where the adhesion layer is configured to promote adhesion between the second portions of the first RDL and the polymer layer. As another example, one or more of the semiconductor processing tool sets 105-150 may remove the adhesion layer from the first polymer layer prior to forming the one or more second polymer layers and the one or more second RDLs of the redistribution structure.

The number and arrangement of tool sets shown in FIG. 1 are provided as one or more examples. In practice, there may be additional tool sets, different tool sets, or differently arranged tool sets than those shown in FIG. 1. Furthermore, two or more tool sets shown in FIG. 1 may be implemented within a single tool set, or a tool set shown in FIG. 1 may be implemented as multiple, distributed tool sets. Additionally, or alternatively, one or more tool sets of environment 100 may perform one or more functions described as being performed by another tool set of environment 100.

Figure 2A:
FIGS. 2A-2C are diagrams of an example semiconductor device package described herein.
Figure 2B:
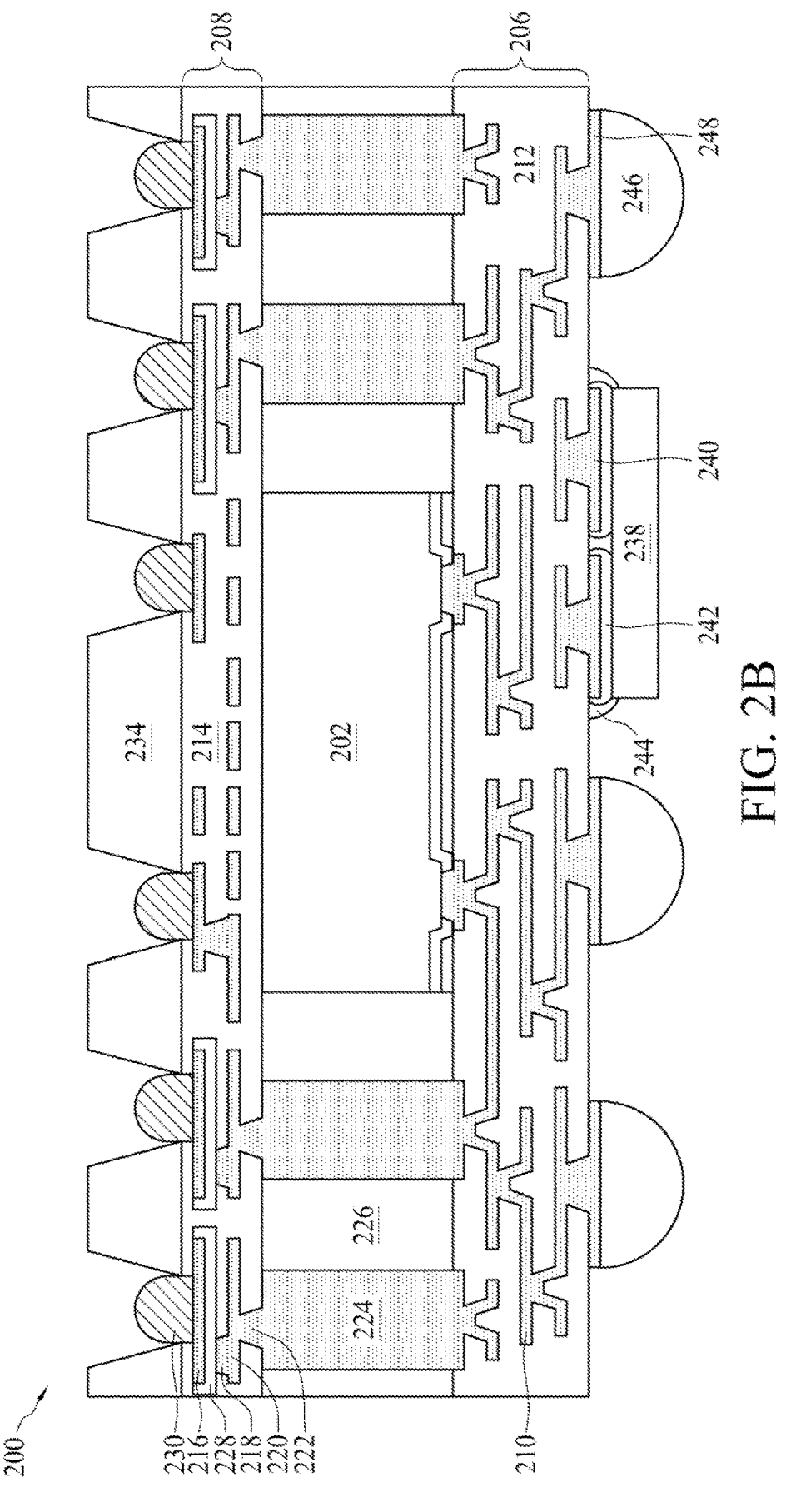
Figure 2C:
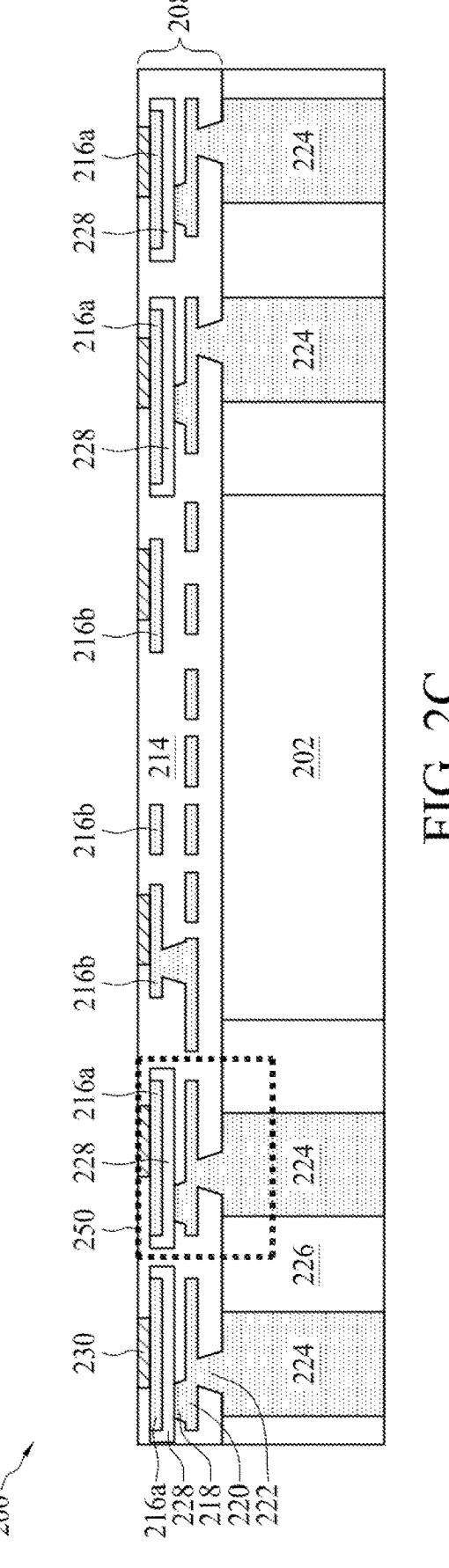

FIGS. 2A-2C are diagrams of an example semiconductor device package 200 described herein. The semiconductor device package 200 includes a packaged semiconductor device that includes one or more semiconductor die packages. The semiconductor device package 200 may be referred to as a package on package (PoP) semiconductor device package, a 3D package, a 2.5D package, an integrated fanout (InFO) package, and/or another type of semiconductor device package that includes a one or more semiconductor die packages.

FIG. 2A illustrates a cross-section view of the semiconductor device package 200. As shown in FIG. 2A, the semiconductor device package 200 may include a semiconductor die package 202 and a semiconductor die package 204. The semiconductor die package 202 and the semiconductor die package 204 may be stacked or vertically arranged in the semiconductor device package 200. In particular, the semiconductor die package 204 may be included over the semiconductor die package 202.

The semiconductor die package 202 may include one or more semiconductor dies, such as a logic die, a system-on-chip (SoC) die, a memory die, an input/output (I/O) die, and/or another type of semiconductor die, among other examples. The semiconductor die package 204 may include one or more semiconductor dies, such as a memory die, a high band width memory (HBM) die, a static random access memory (SRAM) die, a dynamic random access memory (DRAM) die, and/or another type of die, among other examples. Each of the semiconductor die packages 202 and 204 may include one or more other structures, such as a substrate, an interposer, and/or connection structures, among other examples described herein.

The semiconductor die package 202 may be included over and/or on a redistribution structure 206. The redistribution structure 206 may be referred to as a frontside redistribution structure. The semiconductor die package 202 may be electrically connected with and/or attached to the redistribution structure 206. Another redistribution structure 208 may be included above and/or over the semiconductor die package 202. The redistribution structure 208 may be referred to as a backside redistribution structure. The semiconductor die package 204 may be electrically connected with and/or attached to the redistribution structure 208.

The redistribution structure 206 may include one or more metallization layers 210 disposed in one or more polymer layers 212. The semiconductor die package 202 may be electrically connected with and/or attached to one or more metallization layers 210 of the redistribution structure 206. The one or more metallization layer 210 of the redistribution structure 206 may include one or more materials such as a gold (Au) material, a copper (Cu) material, a silver (Ag) material, a nickel (Ni) material, a tin (Sn) material, and/or a palladium (Pd) material, among other examples. The one or more metallization layers 210 of the redistribution structure 206 may include metal lines, vias, interconnects, and/or another type of metallization layers that enable fanout of I/O connections on the semiconductor die packages 202 and 204. The polymer layer(s) 212 may include polybenzoxazole (PBO), polyimide, benzocyclobutene (BCB), silicon oxide (SiO$_x$), dielectric layer(s), and/or another suitable dielectric material.

The redistribution structure 208 may include a plurality of metallization layers disposed in one or more polymer layers 214. The semiconductor die package 202 may be electrically connected with and/or attached to one or more metallization layers of the redistribution structure 208. The one or more metallization layers of the redistribution structure 208 may include one or more materials such as a gold (Au) material, a copper (Cu) material, a silver (Ag) material, a nickel (Ni) material, a tin (Sn) material, and/or a palladium (Pd) material, among other examples. The polymer layer(s) 214 may include polybenzoxazole (PBO), polyimide, benzocyclobutene (BCB), silicon oxide (SiO$_x$), dielectric layer(s), and/or another suitable dielectric material.

The one or more metallization layers of the redistribution structure 208 may include metal lines, vias, interconnects, and/or another type of metallization layers that enable fanout of I/O connections on the semiconductor die package 204 and enable signals to be routed between the semiconductor die package 204 and the redistribution structure 206 through the redistribution structure 208. As shown in FIG. 2A, the one or more metallization layers may include an RDL 216 (e.g., a topmost RDL) at a first side (e.g., a top side) of the redistribution structure 208, via structures 218 connected with the RDL 216, an RDL 220 (e.g., a bottommost RDL) at a second side (e.g., a bottom side) of the redistribution structure 208 opposing the first side and connected with the via structures 218, and via structures 222 connected with the RDL 220, among other examples. The RDL 216 may be referred to as a backside RDL1 layer, the via structure 218 may be referred to as a backside PM2 via, the RDL 220 may be referred to as a backside RDL2 layer, and the via structure 222 may be referred to as a backside PM3 via.

The RDL 220 may be electrically connected with a plurality of TIVs 224 that extend through an encapsulation layer 226 between the redistribution structure 206 and the redistribution structure 208. The RDL 220 may be electrically connected with the TIVs 224 through the via structures 222. The TIVs 224 may be electrically connected with a metallization layer 210 of the redistribution structure 206. The TIVs 224 may extend between and may electrically connect the redistribution structure 206 and the redistribution structure 208. The TIVs 224 may be located adjacent to one or more sides of the semiconductor die package 202. The TIVs 224 may enable electrical signals to be transferred between the redistribution structure 206 and the redistribution structure 208, between the semiconductor die package 202 and the semiconductor die package 204, and/or between the semiconductor die package 204 and a device external to the semiconductor device package 200, among other examples. The TIVs 224 may include vias, pillars, interconnects, and/or another type of elongated electrically conductive structures that include one or more conductive materials such as a gold (Au) material, a copper (Cu) material, a silver (Ag) material, a nickel (Ni) material, a tin (Sn) material, and/or a palladium (Pd) material, among other examples.

The encapsulation layer 226 may be included over and/or on the redistribution structure 206. The encapsulation layer 226 may surround and/or encapsulate the semiconductor die package 202 and the TIVs 224. The encapsulation layer 226 may include a molding compound, such as a polymer, one or more fillers dispersed in a resin, an epoxy-based resin, and/or another type of insulating material.

As described above, in some cases, the TIVs 224 may experience thermal expansion, which may result from elevated temperatures in the semiconductor device package 200 during manufacturing, testing, and/or operation of the semiconductor device package 200. The thermal expansion may result in physical stress being transferred to one or more metallization layers in the redistribution structure 208. For example, the TIVs 224 may expand in size due to the thermal expansion, which may result in the TIVs 224 pushing on the via structures 222 and/or the polymer layer(s) 214, thereby causing physical stress to be transferred to the via structures 222 and/or to the polymer layer(s) 214. The physical stress may propagate to other metallization layers of the redistribution structure 208, such as the RDL 216.

This may result in delamination one or more portions of the RDL 216 from the polymer layer (s) 214.

To reduce the likelihood of delamination between the RDL 216 and the polymer layer(s) 214, an adhesion layer 228 may be included on one or more portions of the RDL 216 between the one or more portions and the polymer layer(s) 214. The adhesion layer 228 includes one or more materials that promote and/or increase adhesion between the one or more portions of the RDL 216 and the polymer layer(s) 214 to resist and/or otherwise reduce the likelihood of delamination between the one or more portions of the RDL 216 and the polymer layer(s) 214. The adhesion layer 228 may include titanium (Ti) and/or another material that promotes and/or increases adhesion between the one or more portions of the RDL 216 and the polymer layer(s) 214. In some implementations, the material of the adhesion layer 228 may be selected to achieve a particular contact resistance performance and/or a particular sheet resistance performance.

The adhesion layer 228 may be included on one or more sides and/or on one or more surfaces of the one or more portions of the RDL 216. For example, the adhesion layer 228 may be included on a bottom side or bottom surface facing the via structures 218 and the RDL 220. As another example, the adhesion layer 228 may be included on side surfaces that face adjacent portions of the RDL 216. In some implementations, the adhesion layer 228 is included on all sides of the one or more portions of the RDL 216 such that the one or more portions of the RDL 216 are encapsulated and/or surrounded by the adhesion layer 228.

In some implementations, the adhesion layer 228 may be included on other metallization layers of the redistribution structure 208, such as one or more of the via structures 218, one or more portions of the RDL 220, and/or one or more of the via structures 222. In some implementations, the adhesion layer 228 may be included on one or more of the metallization layers 210 in the redistribution structure 206 to resist and/or otherwise reduce the likelihood of delamination between the one or more portions of the one or more of the metallization layers 210 and the polymer layer(s) 212.

The RDL 216 may be electrically connected with connectors 230 that electrically connect the semiconductor die package 204 with the redistribution structure 208. The connectors 230 are electrically connected with bottom connection structures 232 of the semiconductor die package 204. The connectors 230 may include solder balls, solder bumps, controlled collapse chip connection (C4) bumps, and/or micro bumps, among other examples. The bottom connection structures 232 may include one or more materials such as a gold (Au) material, a copper (Cu) material, a silver (Ag) material, a nickel (Ni) material, a tin (Sn) material, and/or a palladium (Pd) material, among other examples.

A backside enhance layer (BEL) film 234 may be included over and/or on the first side (e.g., the top side) of the redistribution structure 208. The BEL film 234 may include a non-conductive material that provides increased structural rigidity for the semiconductor device package 200 to reduce the likelihood of warpage in the semiconductor device package 200. The BEL film 234 may extend above the connectors 230 to protect the connectors 230 during shipping and/or other semiconductor processes. An underfill material 236 may be included over the BEL film 234. The underfill material 236 may be included to fill in the gaps between the semiconductor die package 204 and the BEL film 234. The underfill material 236 may a polymer, one or more fillers dispersed in a resin, an epoxy-based resin, and/or another type of insulating material.

As further shown in FIG. 2A, the semiconductor device package 200 may include an integrated passive device (IPD) 238 that is connected to bottom side of the redistribution structure 206 opposing a side of the redistribution structure 206 to which the semiconductor die package 202 is attached. The IPD 238 may include one or more capacitors, one or more resistors, one or more inductors, and/or one or more passive components of another type. The IPD 238 may be attached to the bottom side of the redistribution structure 206 by bonding pads 240, which are electrically connected to the metallization layers 210 of the redistribution structure 206, and connectors 242. An underfill material 244 may be provided between the redistribution structure 206 and the IPD 238 to fill in gaps between the bonding pads 240 and the connectors 242.

The semiconductor device package 200 may include conductive terminals 246 that are attached to the bottom side of the redistribution structure 206 by conductive pads 248. The conductive terminals 246 may include ball grid array (BGA) balls, land grid array (LGA) pads, pin grid array (PGA) pins, and/or another type of conductive terminals. The conductive terminals 246 may enable the semiconductor device package 200 to be mounted to a circuit board, a socket (e.g., an LGA socket), and/or another type of mounting structure. The conductive pads 248 may be electrically connected to the metallization layers 210 of the redistribution structure 206.

FIG. 2B illustrates an implementation in which the semiconductor die package 204 and the underfill material 236 are omitted from the semiconductor device package 200. This implementation may be referred to as a "bottom only" semiconductor device package, an InFO bottom (InFO-B) semiconductor device package, and/or another type of semiconductor device package in which only the "bottom" semiconductor die package (e.g., the semiconductor die package 202) is included. This provides modularity and customization for the semiconductor device package 200 in that this implementation enables the type of the semiconductor die package to be selected by an end user or end manufacturer for the semiconductor die package 204. In this implementation, the adhesion layer 228 is included around the portions of the RDL 216 that are located over the TIVs 224 to promote adhesion between the portions of the RDL 216 and the polymer layer(s) 214.

FIG. 2C illustrates a portion of the semiconductor device package 200 including the semiconductor die package 202, the redistribution structure 208, the TIVs 224, and the encapsulation layer 226. As shown in FIG. 2C, portions 216a of the RDL 216 is included in the "shadow" of the TIVs 224. That is, the portions 216a of the RDL 216 are located above and over the TIVs 224 such that the portions 216a are vertically aligned with the TIVs 224. Accordingly, the portions 216a are at least partially within the perimeter of the TIVs 224. The portions 216a of the RDL 216 are surrounded by and/or encapsulated by the adhesion layer 228 to reduce the likelihood of delamination between the RDL 216 and the polymer layer(s) 214 that might otherwise result from the transfer of stress from the TIVs 224 to the portions 216a of the RDL 216.

As further shown in FIG. 2C, in some implementations, the adhesion layer 228 may be omitted from portions 216b of the RDL 216 that are located outside of the "shadow" of the TIVs 224. For example, the adhesion layer 228 may be omitted from portions 216b of the RDL 216 that are over the semiconductor die package 202. Accordingly, one or more sides (or all of the sides) the portions 216a of the RDL 216 may be in direct contact with the polymer layer 214 of the redistribution structure 208. The adhesion layer 228 may be omitted from the portions 216b because of the low likelihood that stress from thermal expansion of the TIVs 224 will be transferred to the portions 216b. However, in other implementations, the adhesion layer 228 may be included on the portions 216b of the RDL 216 as well.

As indicated above, FIGS. 2A-2C are provided as an example. Other examples may differ from what is described with regard to FIGS. 2A-2C.

Figure 3:
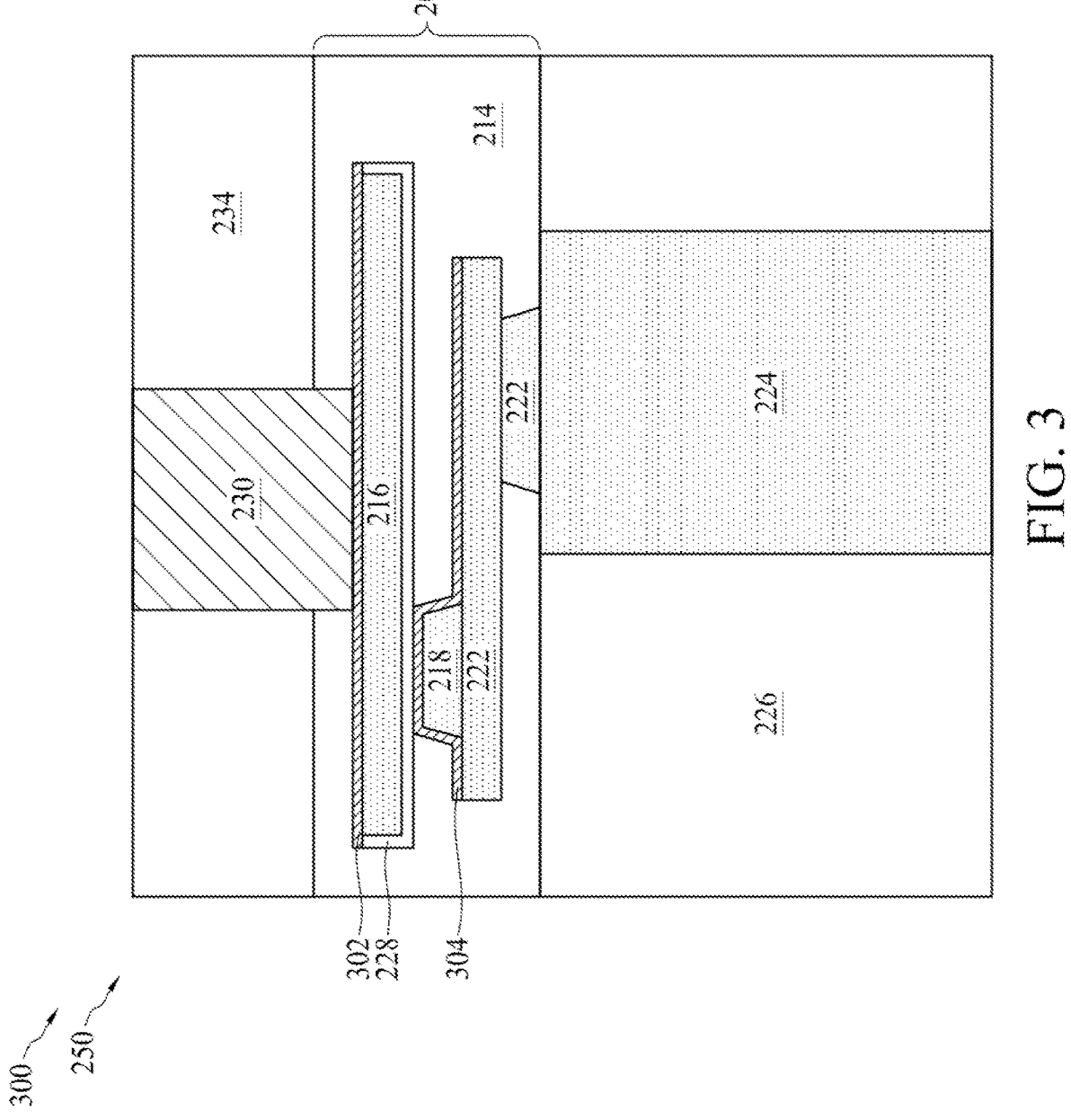
FIG. 3 is a diagram of an example implementation of a semiconductor device package described herein.

FIG. 3 is a diagram of an example implementation 300 of the semiconductor device package 200 described herein. In particular, the example implementation 300 includes an example of a portion 250 of the semiconductor device package 200 illustrated in FIG. 2C. The portion 250 includes a portion of the redistribution structure 208, a portion of a TIV 224, a portion of the encapsulation layer 226, a portion of a connector 230, and a portion of the BEL film 234.

As shown in FIG. 3, the portion of the redistribution structure 208 above and over the TIV 224 may include the RDL 216, a via structure 218, the RDL 220, an a via structure 222. The via structure 222 may be above and over the TIV 224, and connected with the TIV 224. The RDL 220 may be above and over the via structure 222 and the TIV 224, and connected with the via structure 222 (and the TIV 224 through the via structure 222). The via structure 218 may be above and over the RDL 220, and connected with the RDL 220. The RDL 216 may be above and over the via structure 218, the RDL 220, the via structure 222, and the TIV 224. The RDL 216 may be connected with the via structure 218. The connector 230 may be above and over the RDL 216 and connected with the RDL 216.

As further shown in FIG. 3, the adhesion layer 228 may be included on one or more sides of the RDL 216 between the RDL 216 and the polymer layer 214 of the redistribution structure 208. For example, the adhesion layer 228 may be included on a bottom side of the RDL 216 between the RDL 216 and the polymer layer 214, and between the RDL 216 and the via structure 218. As another example, the adhesion layer 228 may be included on sidewalls of the RDL 216 between the RDL 216 and the polymer layer 214.

As further shown in FIG. 3, one or more seed layers may be included in the redistribution structure 208. For example, a seed layer 302 may be included on a top surface of the RDL 216 between the RDL 216 and the polymer layer 214, and between the RDL 216 and the connector 230. The seed layer 302 may include titanium (Ti), copper (Cu), and/or another suitable seed material on which the RDL 216 is formed. The seed layer 302 may be formed on the polymer layer 214 prior to formation of the RDL 216 to promote adhesion between the RDL 216 and the polymer layer 214. Thus, the combination of the adhesion layer 228 and the seed layer 302 may be referred to as an adhesion layer that fully surrounds and/or encapsulates the RDL 216 (e.g., on all sides of the RDL 216).

As another example, a seed layer 304 may be included on the via structure 218 and on the top surface of the RDL 220. The seed layer 304 may include titanium (Ti), copper (Cu), and/or another suitable seed material on which the via structure 218 and the RDL 220 are formed. The seed layer 304 may be formed on the polymer layer 214 and on the adhesion layer 228 (or directly on the RDL 216) prior to formation of the via structure 218 and the RDL 220 to promote adhesion between the polymer layer 214 and the via structure 218 and the RDL 220.

As indicated above, FIG. 3 is provided as an example. Other examples may differ from what is described with regard to FIG. 3.

Figure 4A:
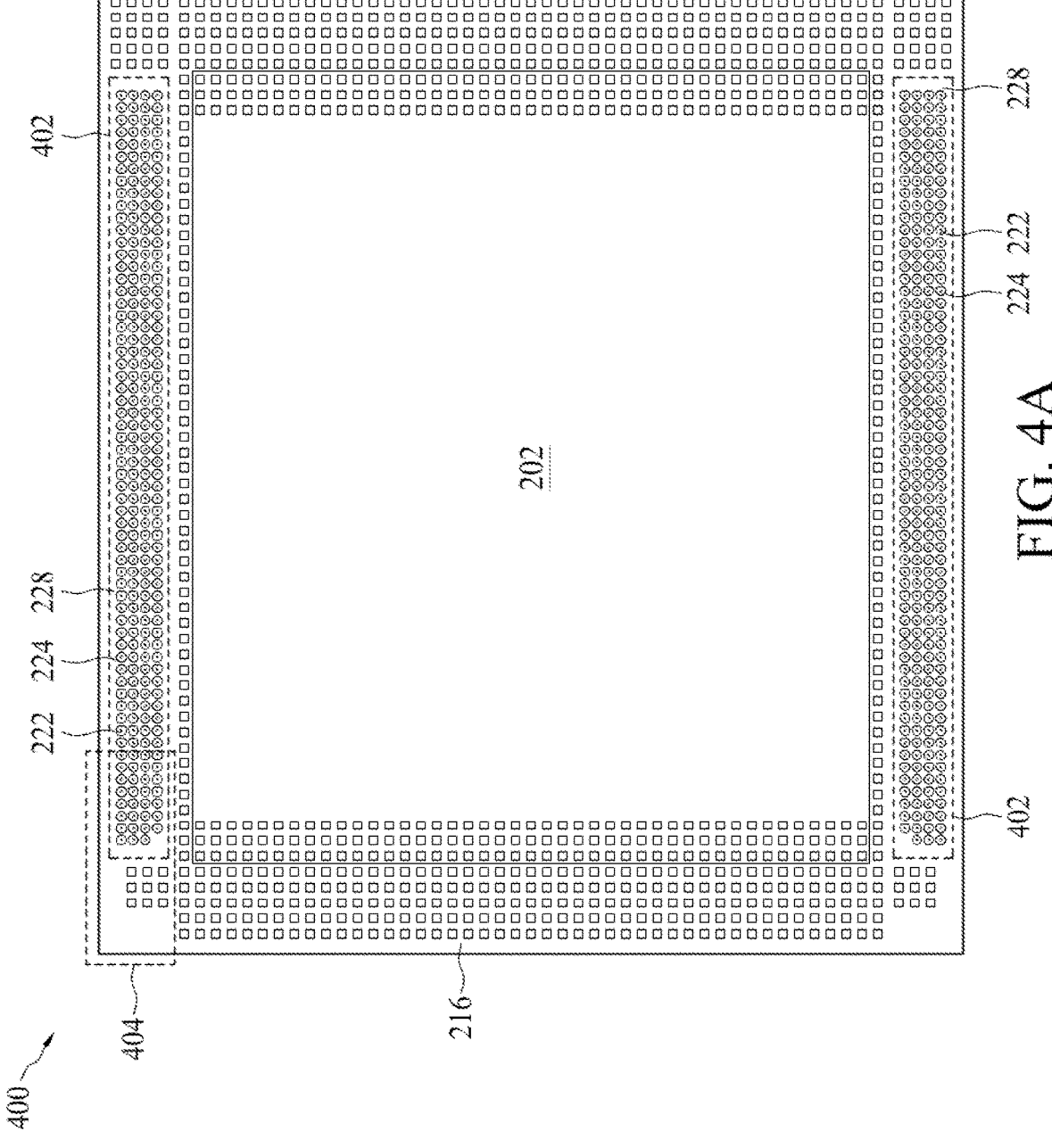
FIGS. 4A-4C are diagrams of an example implementation of a semiconductor device package described herein.
Figure 4B:
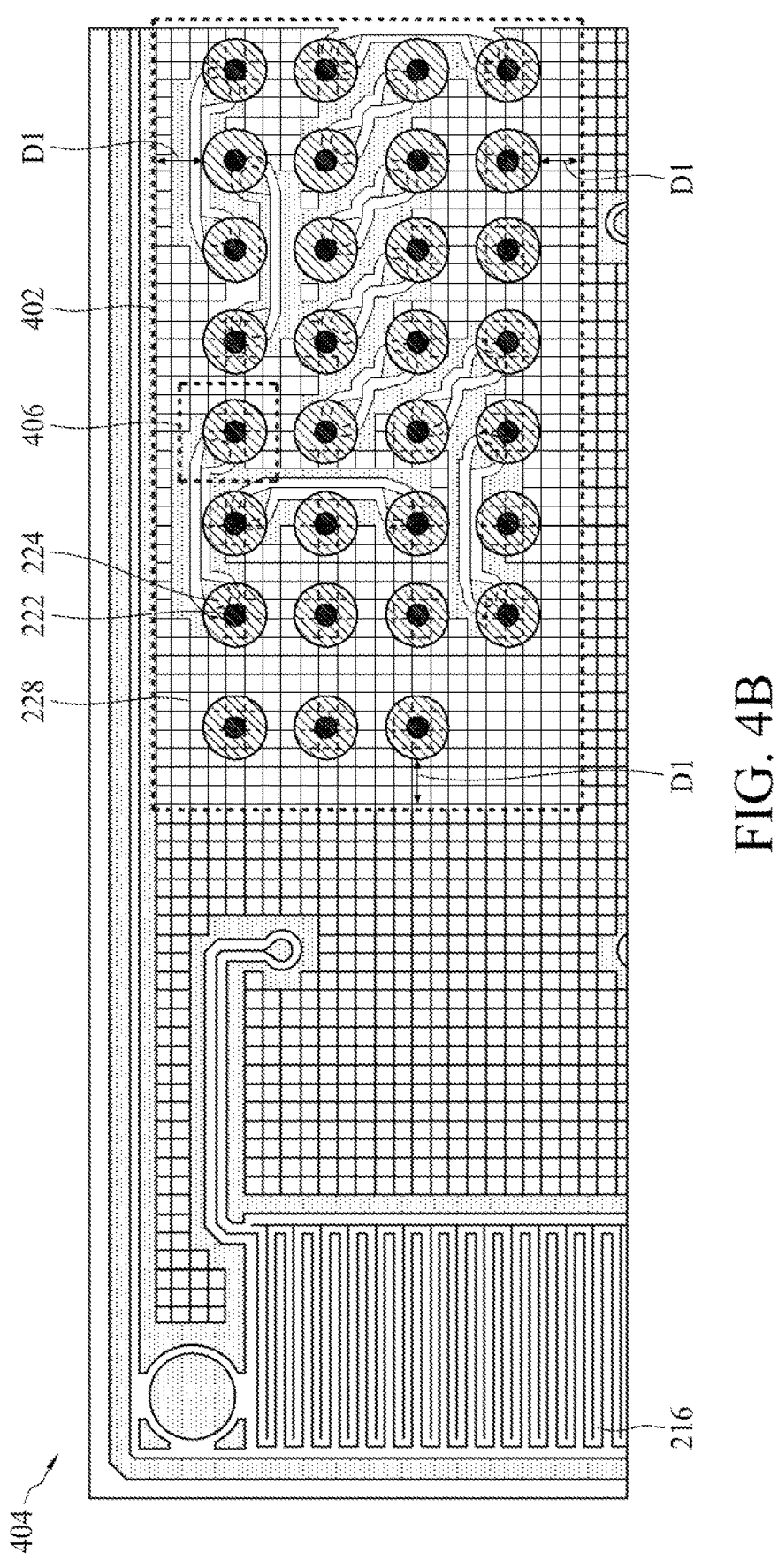
Figure 4C:
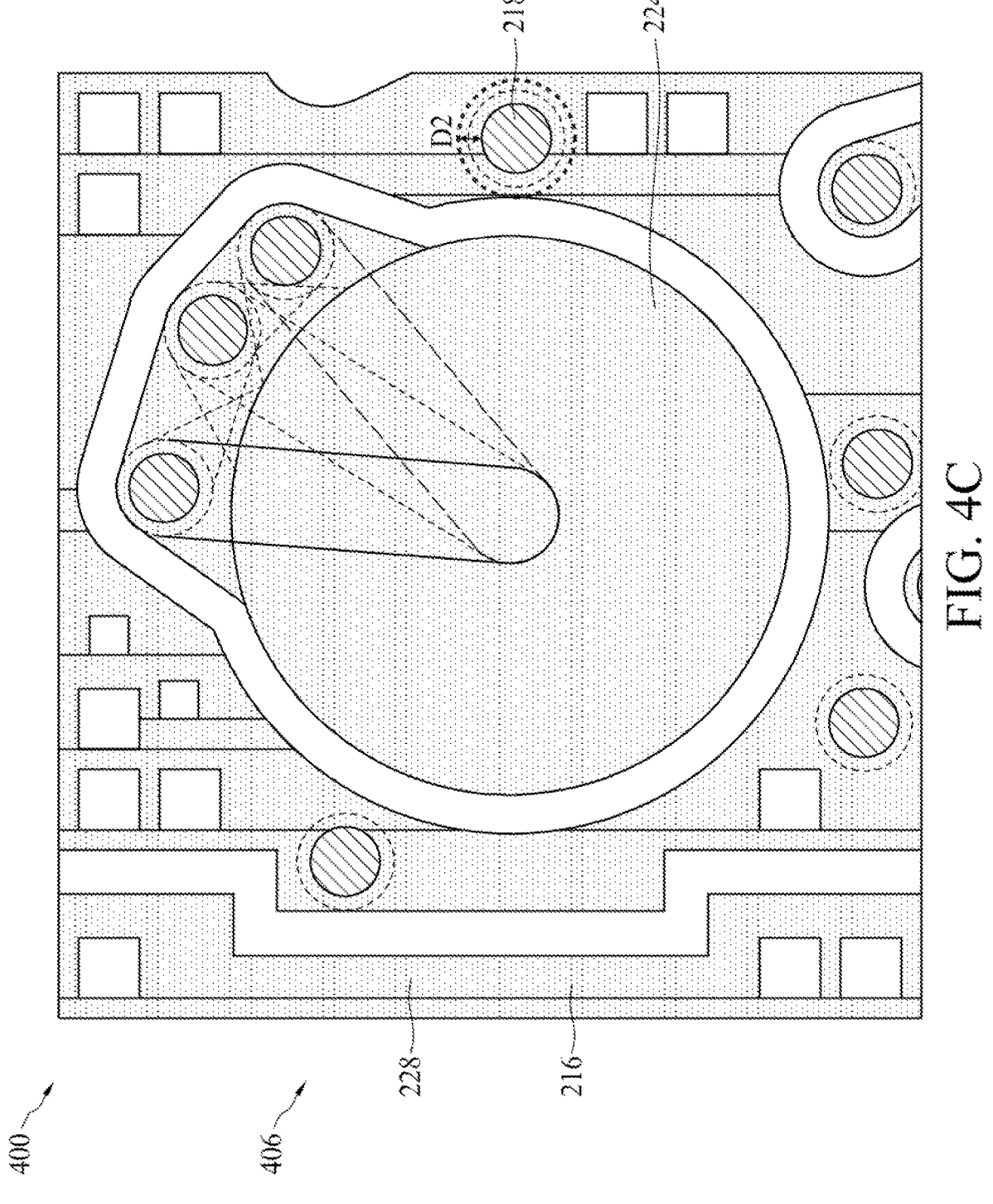

FIGS. 4A-4C are diagrams of an example implementation 400 of the semiconductor device package 200 described herein. FIGS. 4A-4C illustrate top-down views of one or more portions of the semiconductor device package 200.

As shown in FIG. 4A, the TIVs 224 of the semiconductor device package 200 may be included adjacent to one or more sides of the semiconductor die package 202. In some implementations, the TIVs 224 are included in a TIV region 402 of the semiconductor device package 200. In some implementations, groups or subsets of TIVs 224 may be included in respective TIV regions 402 that are adjacent to two or more sides of the semiconductor die package 202, as shown in the example in FIG. 4A. The TIVs 224 in a TIV region 402 may be arranged in a grid pattern or in another pattern.

The TIVs 224 are superimposed on the via structures 222 in FIG. 4A, and the via structures 222 are superimposed on the RDL 216. As shown in FIG. 4A, the adhesion layer 228 is included over and/or on the RDL 216 in the TIV region(s) 402 of the semiconductor device package 200.

FIG. 4B illustrates a detailed top-down view in a portion 404 of the semiconductor device package 200 shown in FIG. 4A. As shown in FIG. 4B, the RDL 216 may extend laterally outward from the TIVs 224 in the TIV region(s) 402. Accordingly, the adhesion layer 228 in the TIV region(s) 402 surround the portions of the RDL 216 that extend laterally outward from the TIVs 224 in the TIV region(s) 402. The adhesion layer 228 may extend laterally outward from any TIV 224 at least by a distance D1, which may be included in a range of approximately 90 microns to approximately 110 microns to provide enhanced adhesion in a sufficient area laterally outward from the TIVs 224 to reduce the likelihood of delamination in the redistribution structure 208. However, other values for the range are within the scope of the present disclosure.

FIG. 4C illustrates a detailed top-down view in a portion 406 of the semiconductor device package 200 shown in FIG. 4B. As shown in FIG. 4C, the adhesion layer 228 may be included on the RDL 216 around the via structures 218 in the TIV region (s) 402. As further shown in FIG. 4C, the RDL 216 may extend laterally outward from the via structures 222 in the TIV region(s) 402. Accordingly, the adhesion layer 228 in the TIV region(s) 402 surround the portions of the RDL 216 that extend laterally outward from the via structures 222 in the TIV region(s) 402. The adhesion layer 228 may extend laterally outward from any via structure 222 at least by a distance D2, which may be included in a range of approximately 5 microns to approximately 10 microns to provide enhanced adhesion in a sufficient area laterally outward from the via structures 222 to reduce the likelihood of delamination in the redistribution structure 208. However, other values for the range are within the scope of the present disclosure.

As indicated above, FIGS. 4A-4C are provided as examples. Other examples may differ from what is described with regard to FIGS. 4A-4C.

Figure 5:
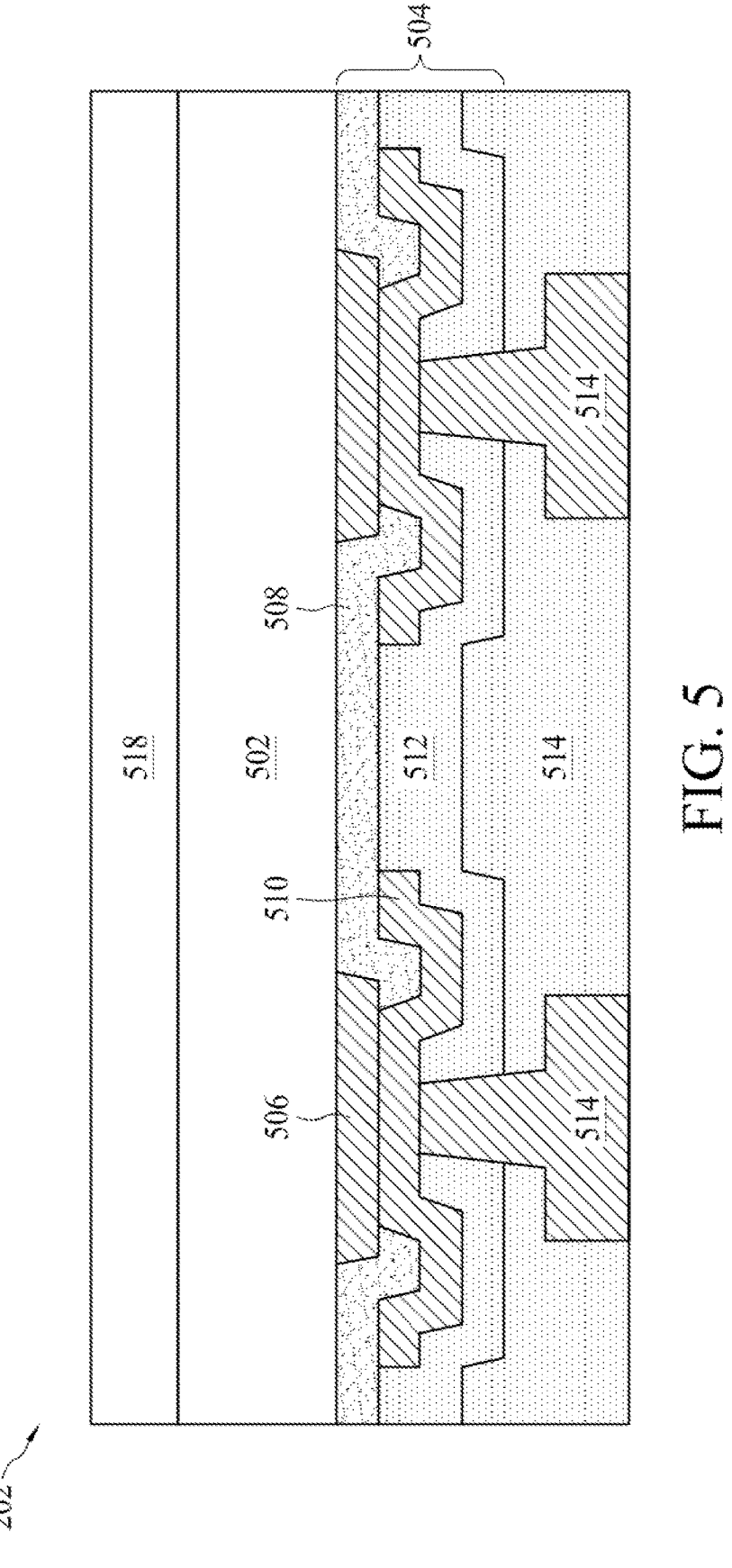
FIG. 5 is a diagram of an example implementation of a semiconductor die package described herein.

FIG. 5 is a diagram of an example implementation 500 of the semiconductor die package 202 described herein. The semiconductor die package 202 may include one or more semiconductor dies 502. The one or more semiconductor dies 502 may include a logic die, a memory die, an HBM die, an I/O die, a system-on-chip (SoC) die, a DRAM IC die, an SRAM IC die, a central processing unit (CPU) die, a graphics processing unit (GPU) die, a digital signal processing (DSP) die, an application specific integrated circuit (ASIC) die, and/or another type of semiconductor die. The semiconductor dies(s) 502 may be included in a substrate, one or more layers of silicon (Si), and/or one or more layers of another material.

As shown in FIG. 5, the semiconductor die(s) 502 may be attached to a connection structure 504. The connection structure 504 may include an RDL structure, an interconnect structure, and/or an interposer, among other examples. The semiconductor die(s) 502 may be attached to the connection structure 504 by a plurality of conductive structure 506. The conductive structures 506 may include a stud, a pillar, a bump, a solderball, a micro-bump, a contact pad (or contact land), an under-bump metallization (UBM) structure, and/or another type of conductive structure, among other examples. The conductive structures 506 may include one or more materials, such as a gold (Au) material, a copper (Cu) material, a silver (Ag) material, a nickel (Ni) material, a tin (Sn) material, a lead (Pb) material, or a palladium (Pd) material, among other examples. In some implementations, the one or more materials may be lead-free (e.g., Pb-free).

The conductive structures 506 may be surrounded by a passivation layer 508 of the connection structure 504. Metallization layers 510 may be connected with the conductive structures 506. The metallization layers 510 may include metal lines, trenches, vias, pillars, and/or another type of metallization layers. The metallization layers 510 may include one or more materials, such as a gold (Au) material, a copper (Cu) material, a silver (Ag) material, a nickel (Ni) material, a tin (Sn) material, a lead (Pb) material, or a palladium (Pd) material, among other examples.

The metallization layers 510 may be surrounded by a dielectric layer 512. The dielectric layer 512 may include polybenzoxazole (PBO), polyimide, benzocyclobutene (BCB), silicon oxide ($SiO_x$), and/or another suitable dielectric material. The connection structure 504 may include additional metallization layers 510 and/or additional dielectric layers 512 the redistribute electrical signals to and from the semiconductor die(s) 502. Connectors 514 may be electrically connected with the metallization layers 510. The connectors 514 may electrically connect the metallization layers 510 with the metallization layers 210 of the redistribution structure 206.

An insulator layer 516 may be included over the connection structure 504 such that the connection structure 504 is included between the insulator layer 516 and the semiconductor die(s) 502. The insulator layer 516 may be included to fill gaps between the connectors 514 and the redistribution structure 206. The insulator layer 516 may include polybenzoxazole (PBO), polyimide, benzocyclobutene (BCB), silicon oxide ($SiO_x$), and/or another suitable dielectric material. A die attach film (DAF) 518 may be included on a side of the semiconductor die(s) 502 opposing the side to which the connection structure 504 is attached. The DAF 518 may be included to enable the semiconductor die package 202 to be mounted to, and subsequently removed from, a carrier substrate and/or a frame for processing. The DAF 518 may include an epoxy resin, a phenol resin, an acrylic rubber, a silica filler, and/or another suitable material.

As indicated above, FIG. 5 is provided as an example. Other examples may differ from what is described with regard to FIG. 5.

FIGS. 6A-6J are diagrams of an example implementation 600 described herein. The example implementation 600 may include an example of forming a plurality of semiconductor die packages 202, including a semiconductor die package 202*a* and a semiconductor die package 202*b*, on a wafer 602. The semiconductor die package 202*a* may be adjacent to, next, and/or side-by-side with the semiconductor die package 202*b* on the wafer 602. In some implementations, similar operations may be performed to form one or more semiconductor die packages 204.

Figure 6A:
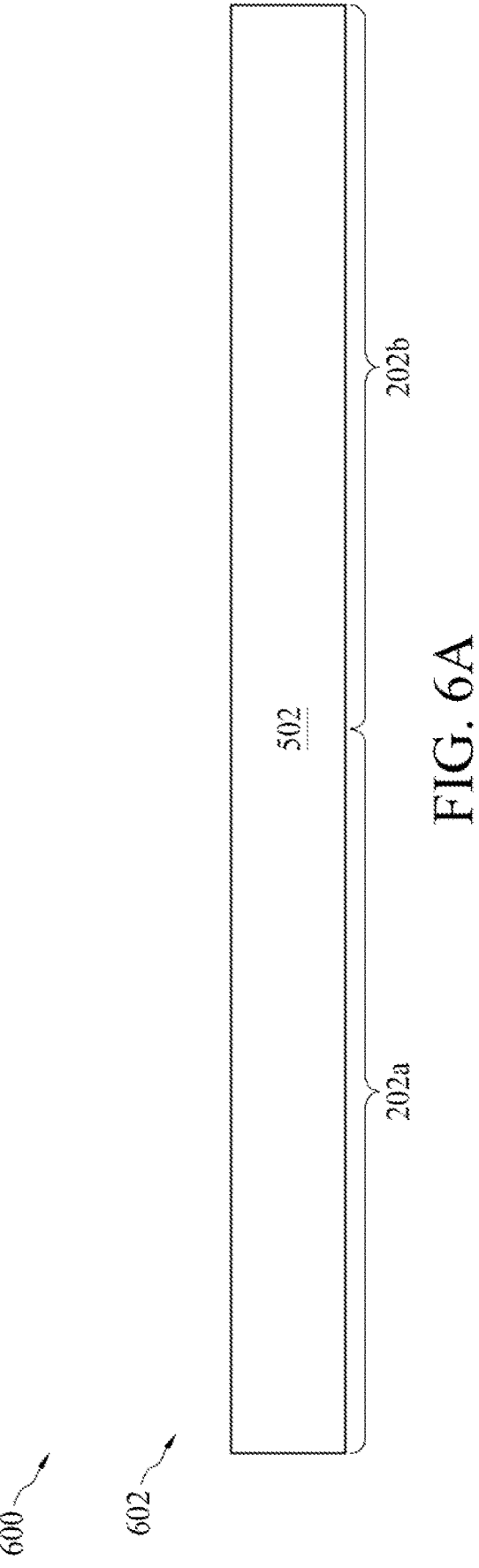
FIGS. 6A-6J are diagrams of an example implementation described herein.

As shown in FIG. 6A, semiconductor die(s) 502 may be formed for the semiconductor die package 202*a* and for the semiconductor die package 202*b*. In some implementations, the semiconductor die(s) 502 may be formed in and/or on the wafer 602. One or more front end of line (FEOL) semiconductor processing tools, one or more middle end of line (MEOL) semiconductor processing tools, and/or one or more back end of line (BEOL) semiconductor processing tools may form the semiconductor die(s) 502 for the semiconductor die package 202*a* and for the semiconductor die package 202*b*. These tools may include photolithography tools (e.g., an exposure tool, a developer tool, and etch tool), deposition tools, plating tools, bonding tools, and/or another type of semiconductor processing tools.

Figure 6B:
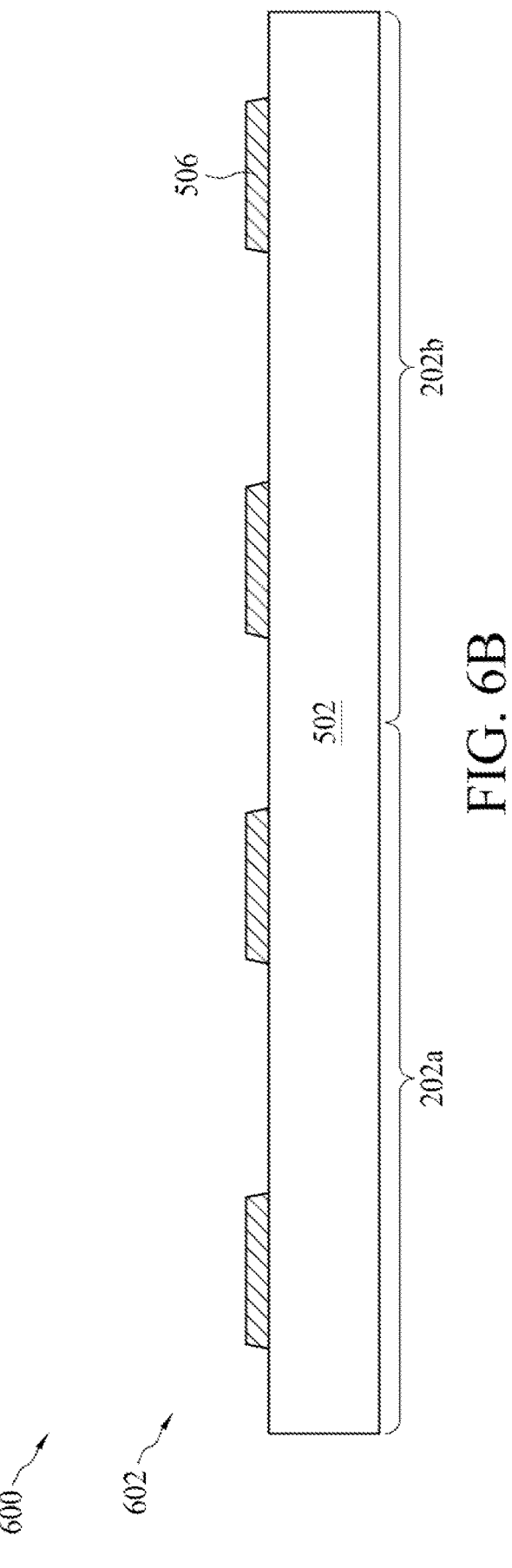

As shown in FIG. 6B, conductive structures 506 may be formed over and/or on the semiconductor die(s) 502. In particular, the connection tool set 115 may form the conductive structures 506 over and/or on the semiconductor die(s) 502.

Forming the conductive structures 506 may include a plurality of processing operations. A seed layer may be formed over and/or on the semiconductor die(s) 502. In some implementations, the seed layer includes a metal layer, which may be a single layer or a composite layer including a plurality of sub-layers formed of different materials. In some implementations, the seed layer includes a titanium (Ti) layer and a copper (Cu) layer over the titanium layer. The seed layer may be formed using, for example, PVD (sputtering), electroplating, CVD, and/or another suitable deposition technique.

After forming the seed layer, a photoresist may then be formed and patterned on the seed layer. The photoresist may be formed by spin coating or by performing another suitable deposition operation. The photoresist may be exposed to light for patterning. The patterning may be performed to form openings through the photoresist to expose the seed layer.

A conductive material may then be formed in the openings of the photoresist and on the exposed portions of the seed layer. The conductive material may be formed by plating, such as electroplating or electroless plating, or by performing another suitable deposition operation. In some implementations, the conductive material is formed in a conformal manner such that the conductive material partially fills the openings through the photoresist. The combination of the conductive material and underlying portions of the seed layer may correspond to the conductive structures 506.

Figure 6C:
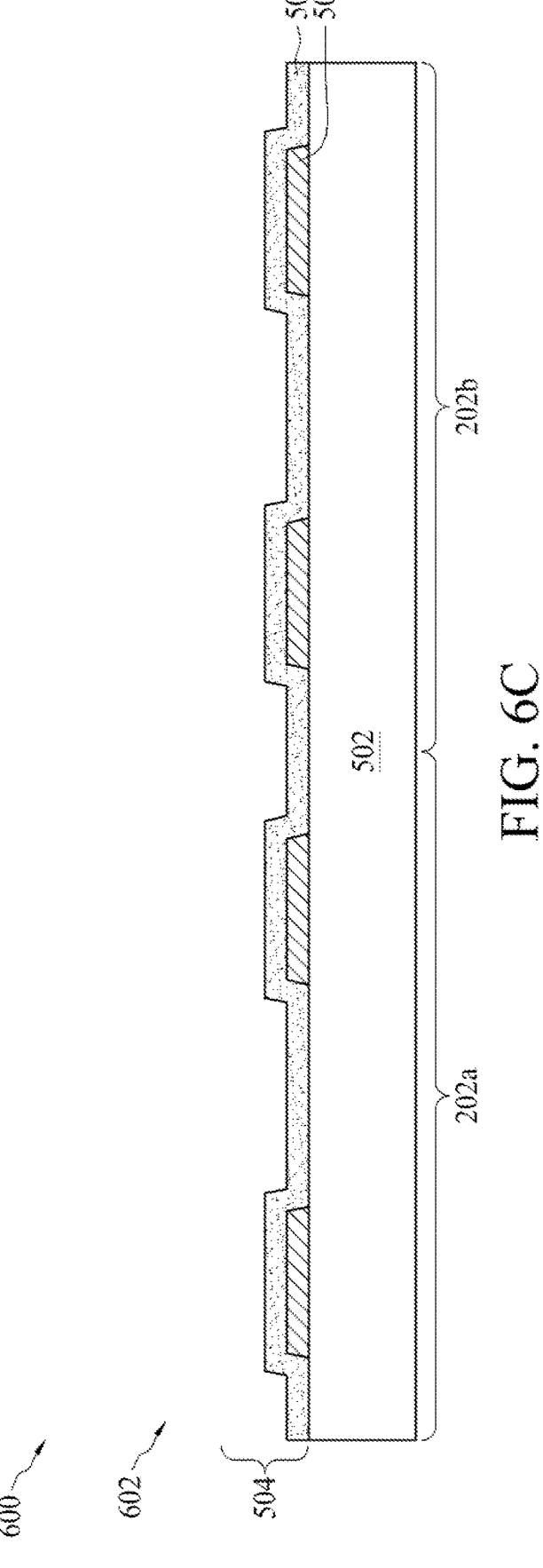

As shown in FIG. 6C, a passivation layer 508 may be formed over and/or on the semiconductor die(s) 502 and over and/or on the conductive structures 506. The RDL tool set 105 may form the passivation layer 508 using a deposition technique, such as a CVD technique, a PVD technique, and/or an ALD technique, among other examples.

Figure 6D:
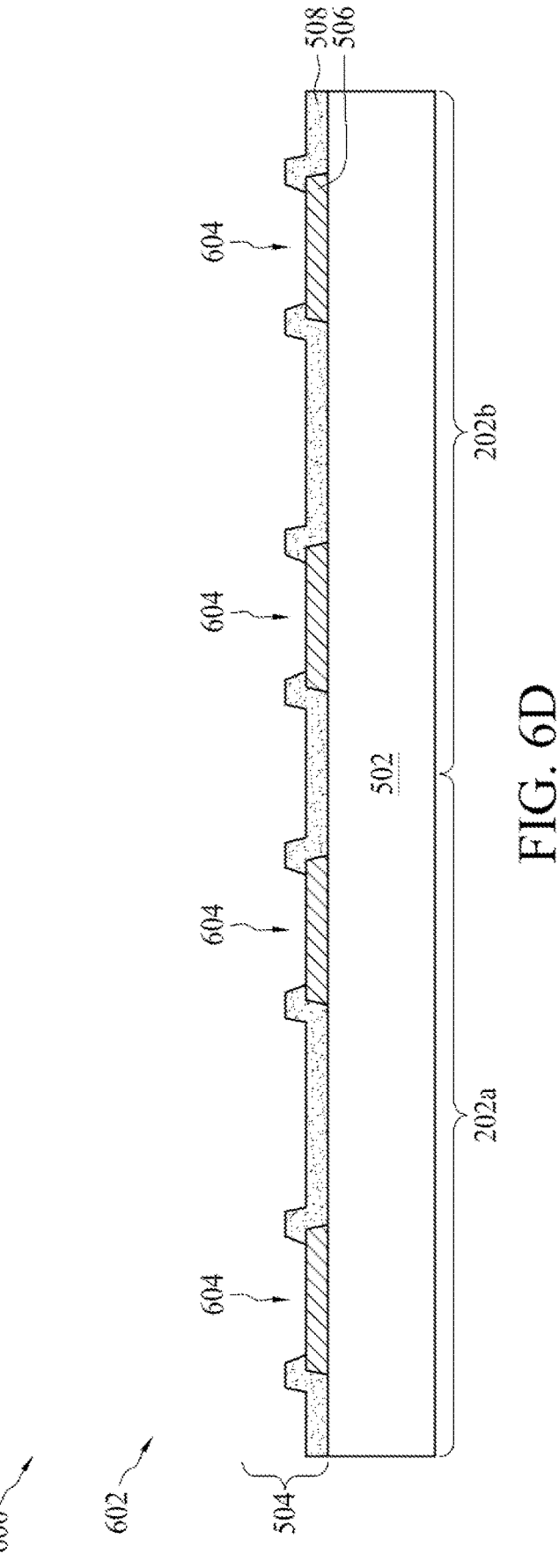

As shown in FIG. 6D, openings 604 may be formed through the passivation layer 508 to expose top surfaces of the conductive structures 506. The RDL tool set 105 may form a photoresist on the passivation layer, may form a pattern in the photoresist, and may etch through the passivation layer 508 using the pattern in the photoresist.

Figure 6E:
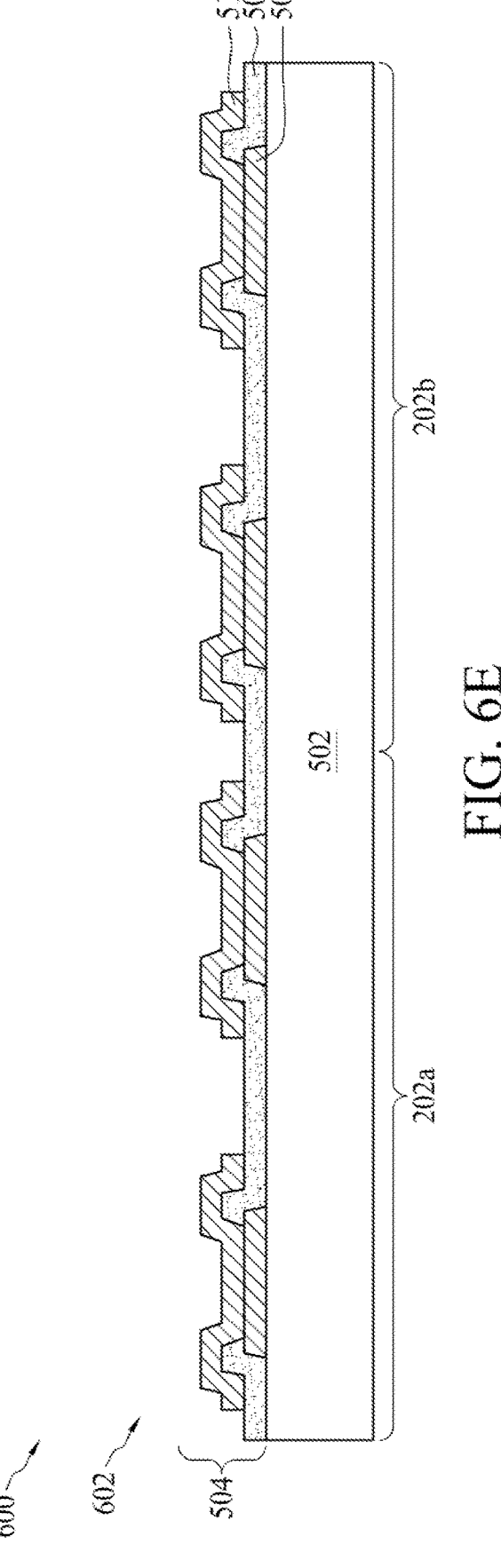

As shown in FIG. 6E, metallization layers 510 of the connection structure 504 may be formed on top of the conductive structures 506. The RDL tool set 105 may form a seed layer over and/or on the conductive structures 506. In some implementations, the seed layer includes a metal layer, which may be a single layer or a composite layer including a plurality of sub-layers formed of different materials. In some implementations, the seed layer includes a titanium (Ti) layer and a copper (Cu) layer over the titanium layer. The seed layer may be formed using, for example, PVD (sputtering), electroplating, CVD, and/or another suitable deposition technique. The RDL tool set 105 may then deposit a conductive material onto the seed layer. The conductive material may be formed by plating, such as electroplating or electroless plating, PVD, CVD, and/or another suitable deposition technique. The combination of the conductive material and underlying portions of the seed layer may correspond to the metallization layers 510.

Figure 6F:
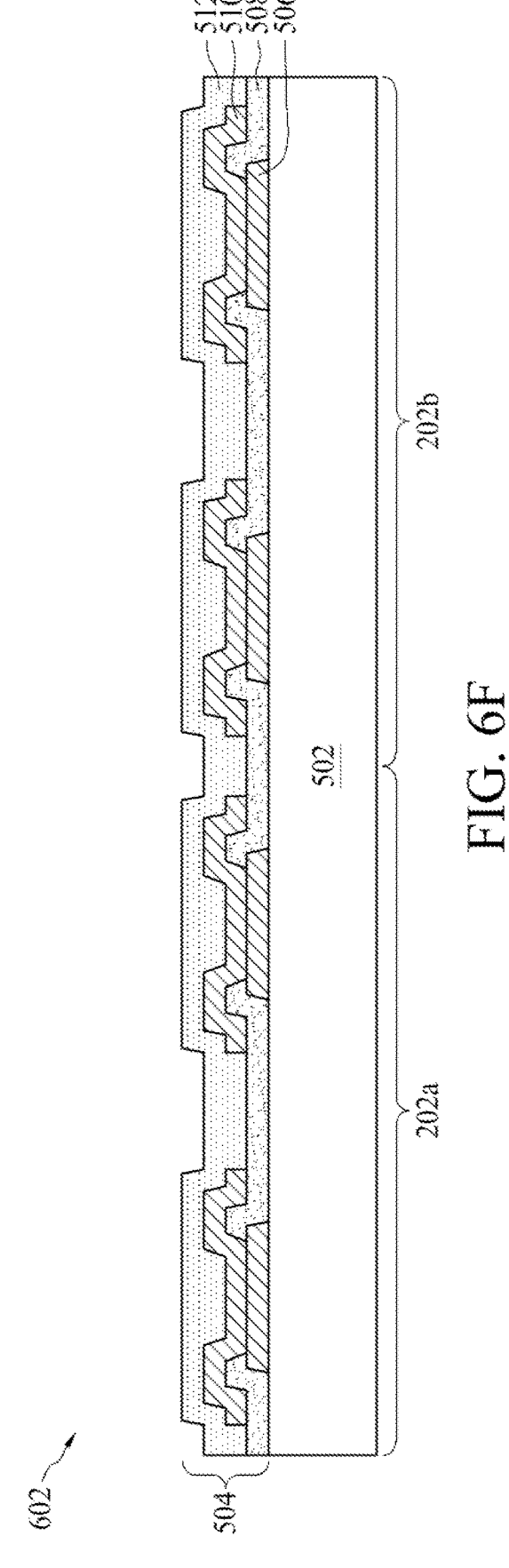

As shown in FIG. 6F, dielectric layers 512 of the connection structure 504. may be formed around the metallization layers 510. In some implementations, the RDL tool set 105 formed a plurality of alternating layers of metallization layers 510 and dielectric layers 512 to form the connection structure 504. The RDL tool set 105 may deposit the dielectric layers 512 using a deposition technique, such as a CVD technique, a PVD technique, and/or an ALD technique, among other examples.

Figure 6G:
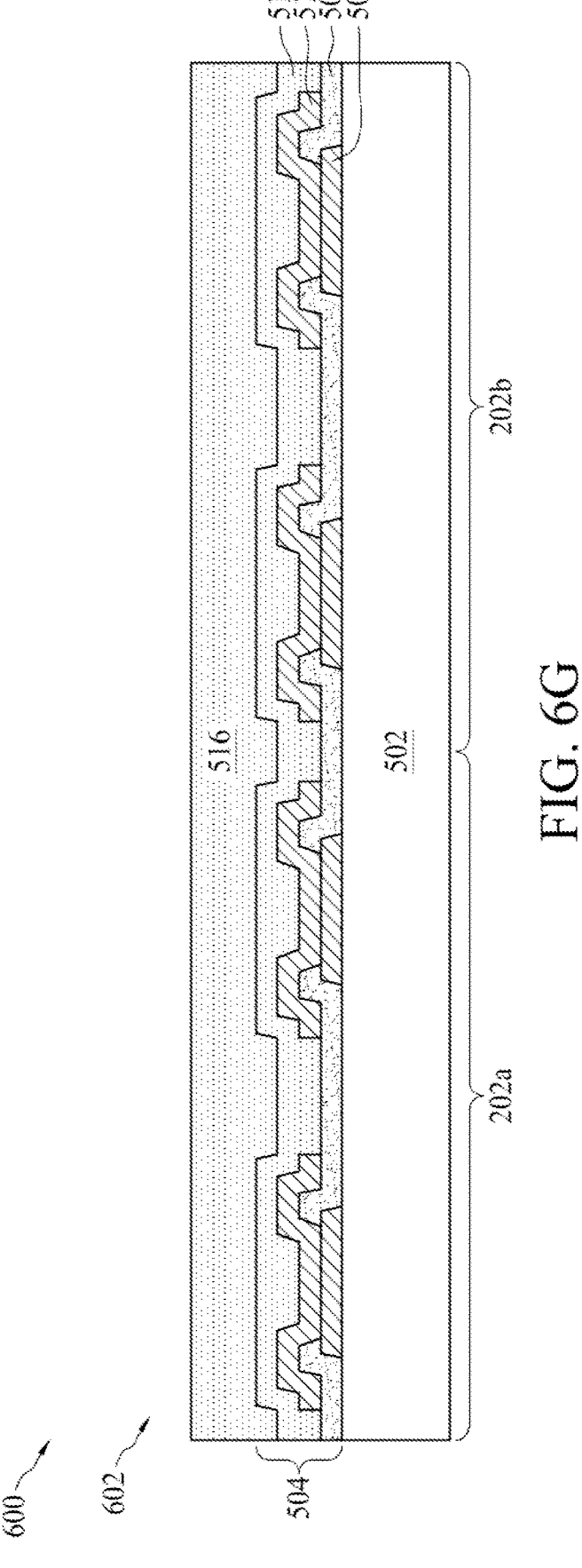

As shown in FIG. 6G, an insulator layer 516 may be formed over and/or on the connection structure 504 (e.g., over and/or on the topmost dielectric layer 512). The RDL tool set 105 may deposit the insulator layer 516 using a deposition technique, such as a CVD technique, a PVD technique, an ALD technique, and/or a spin-coating technique, among other examples.

Figure 6H:
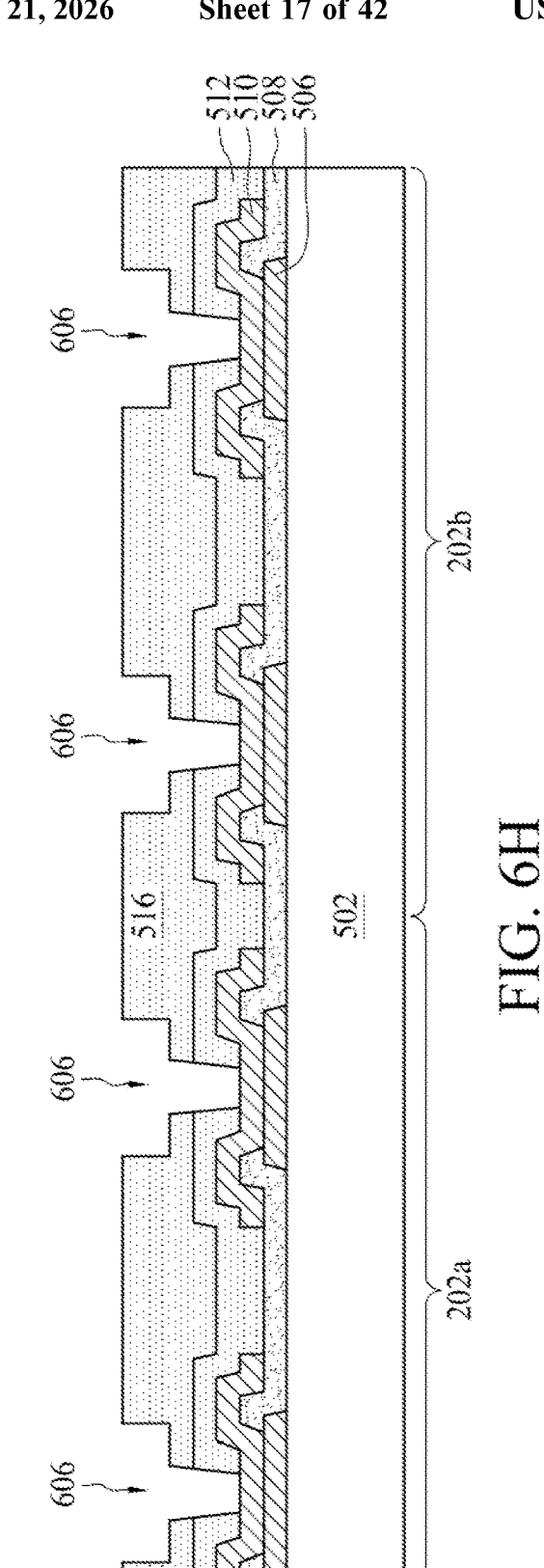

As shown in FIG. 6H, openings 606 may be formed in and/or through the insulator layer 516 and one or more of the dielectric layers 512 to a metallization layer 510. The top surfaces of the metallization layer 510 may be exposed through the openings 606. In some implementations, a pattern in a photoresist layer is used to etch the insulator layer 516 and the one or more of the dielectric layers 512 to form the openings 606. In these implementations, the RDL tool set 105 forms the photoresist layer on the insulator layer 516, exposes the photoresist layer to a radiation source to pattern the photoresist layer, develops and removes portions of the photoresist layer to expose the pattern, and etches the insulator layer 516 based on the pattern to form the openings 606 in the insulator layer 516 and the one or more of the dielectric layers 512. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a photoresist removal tool removes the remaining portions of the photoresist layer (e.g., using a chemical stripper, plasma ashing, and/or another technique).

Figure 6I:
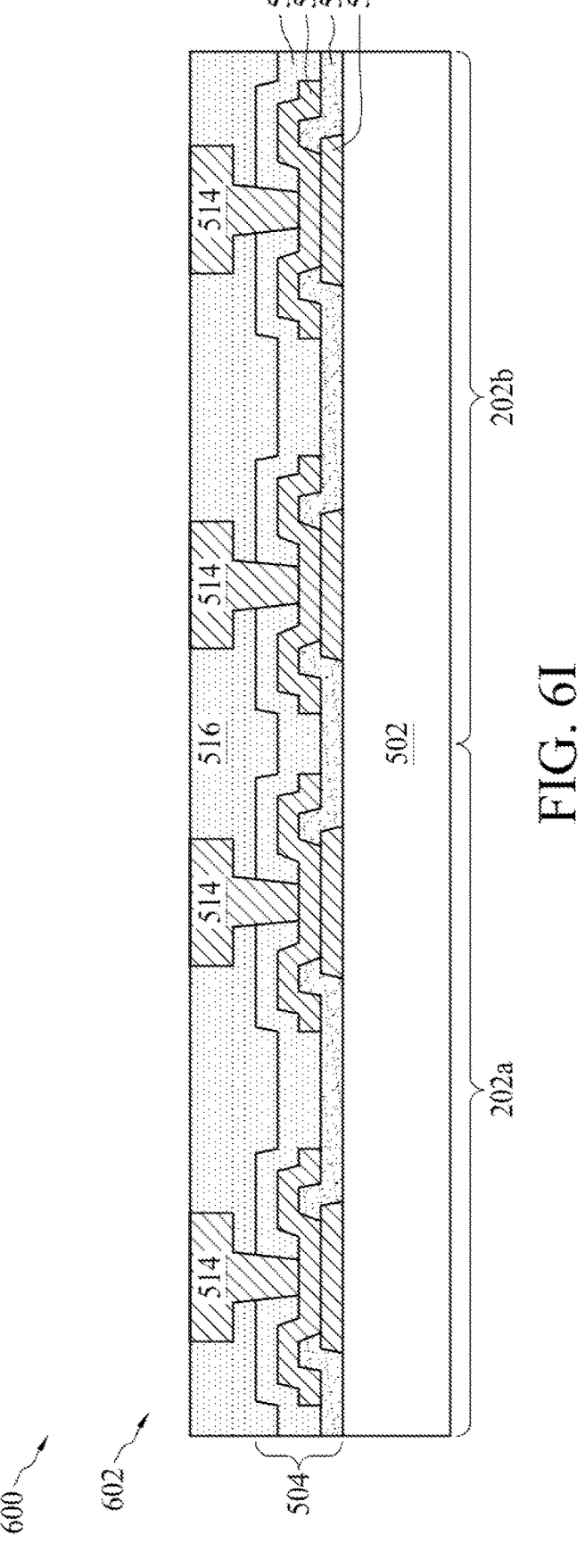

As shown in FIG. 6I, connectors 514 are formed in the openings 606 and over the top surface of the metallization layer 510. In some implementations, the silicon layer of the semiconductor die(s) 502 may be thinned in a wafer thinning process after the connectors 514 are formed, which may include a grinding operation, a planarization operation, and/or another suitable operation.

The connection tool set 115 may form the connectors 514. Forming the connectors 514 may include a plurality of processing operations. A seed layer may be formed over and/or on the metallization layer 510. In some implementations, the seed layer includes a metal layer, which may be a single layer or a composite layer including a plurality of sub-layers formed of different materials. In some implementations, the seed layer includes a titanium (Ti) layer and a copper (Cu) layer over the titanium layer. The seed layer may be formed using, for example, PVD (sputtering), electroplating, CVD, and/or another suitable deposition technique.

After forming the seed layer, a photoresist may then be formed and patterned on the seed layer. The photoresist may be formed by spin coating or by performing another suitable deposition operation. The photoresist may be exposed to light for patterning. The patterning may be performed to form openings through the photoresist to expose the seed layer.

A conductive material may then be formed in the openings of the photoresist and on the exposed portions of the seed layer. The conductive material may be formed by plating, such as electroplating or electroless plating, or by performing another suitable deposition operation. In some implementations, the conductive material is formed in a conformal manner such that the conductive material partially fills the openings through the photoresist. The combination of the conductive material and underlying portions of the seed layer may correspond to the connectors 514.

Figure 6J:
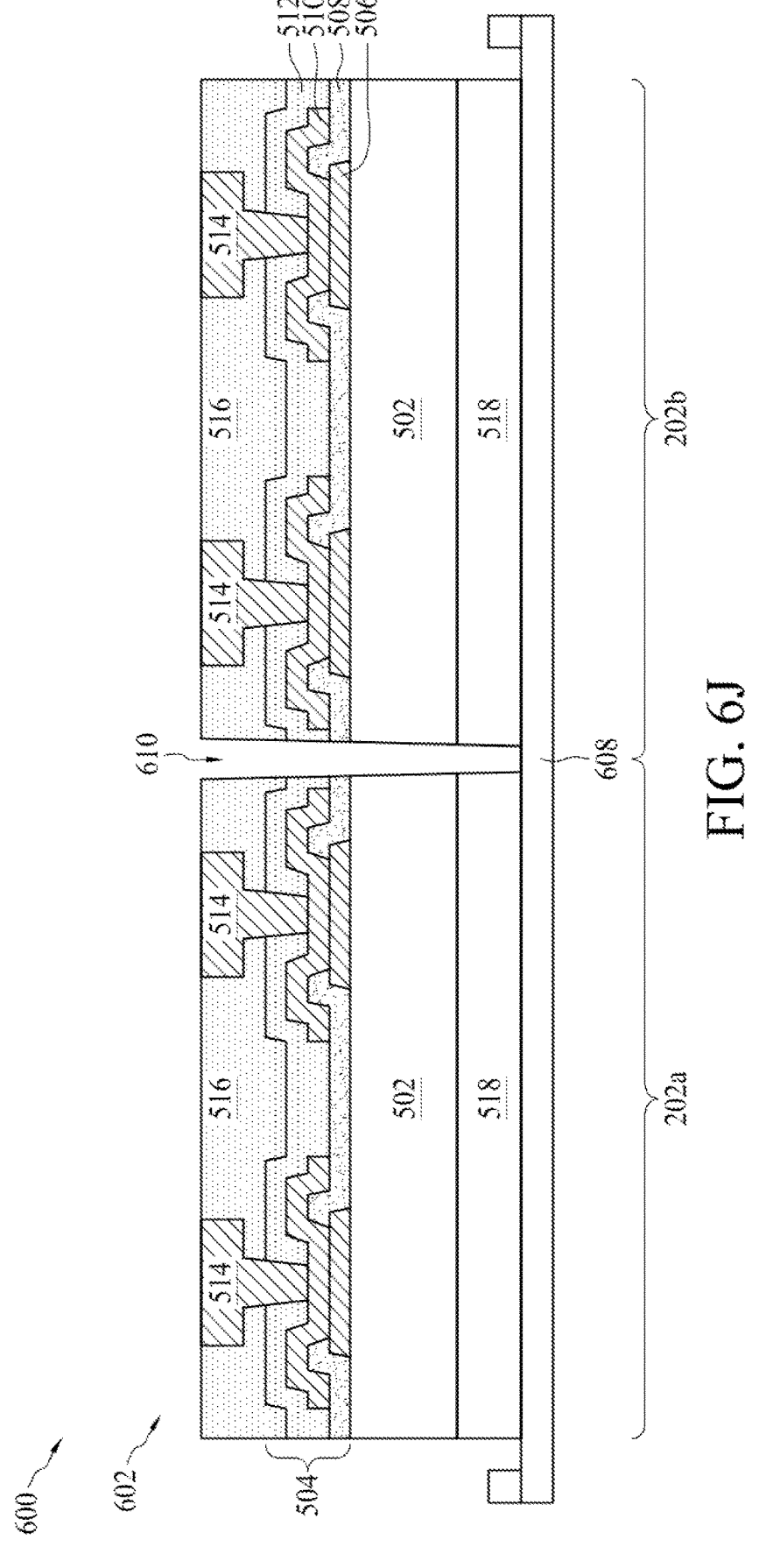

As shown in FIG. 6J, the wafer 602 may be placed on a frame 608 cut or diced into individual semiconductor die packages, including the semiconductor die package 202a and the semiconductor die package 202b. The singulation tool set 125 may perform a singulation process, which may include one or more operations to cut or dice the wafer 602 into individual semiconductor die packages. For example, the singulation tool set 125 may form one or more grooves in a scribe line region between the semiconductor die packages of the wafer 602. The singulation tool set 125 may perform a laser drilling operation and/or another type of operation to form the one or more grooves. Then, the singulation tool set 125 may form a cut line 610 through the full thickness of the wafer 602 through the one or more grooves. The singulation tool set 125 may form the cut line 610 through the full thickness of the wafer 602 to dice or cut the wafer 602 into individual semiconductor die packages 202, including the semiconductor die package 202a and the semiconductor die package 202b. In some implementations, the singulation tool set 125 uses a blade saw or another suitable tool to cut through the wafer 602.

As indicated above, FIGS. 6A-6J are provided as an example. Other examples may differ from what is described with regard to FIGS. 6A-6J.

FIGS. 7A-7I are diagrams of an example implementation 700 described herein. In particular, the example implementation 700 includes an example of forming a redistribution structure 208 (e.g., a backside redistribution structure) of a semiconductor device package 200 described herein. In some implementations, the operations described in connection with FIGS. 7A-7I may be performed after one or more operations described in connection with FIGS. 6A-6J.

Turning to FIG. 7A, one or more of the operations described in connection with the example implementation 700 may be performed over and/or on a carrier substrate 702. One or more layers may be formed on a carrier substrate 702. The carrier substrate 702 may include a glass substrate, a silicon substrate, and/or another suitable carrier substrate. The one or more layers may include a light-to-heat conversion (LTHC) release layer that is formed over and/or on the carrier substrate 702, and an adhesion layer that is formed over and/or on the LTHC release layer. The adhesion layer may be configured to adhere the semiconductor device package 200 to the carrier substrate 702 for processing. The LTHC release layer may be configured to enable the semiconductor device package 200 to be removed or debonded from the carrier substrate 702 after processing.

Figure 7B:
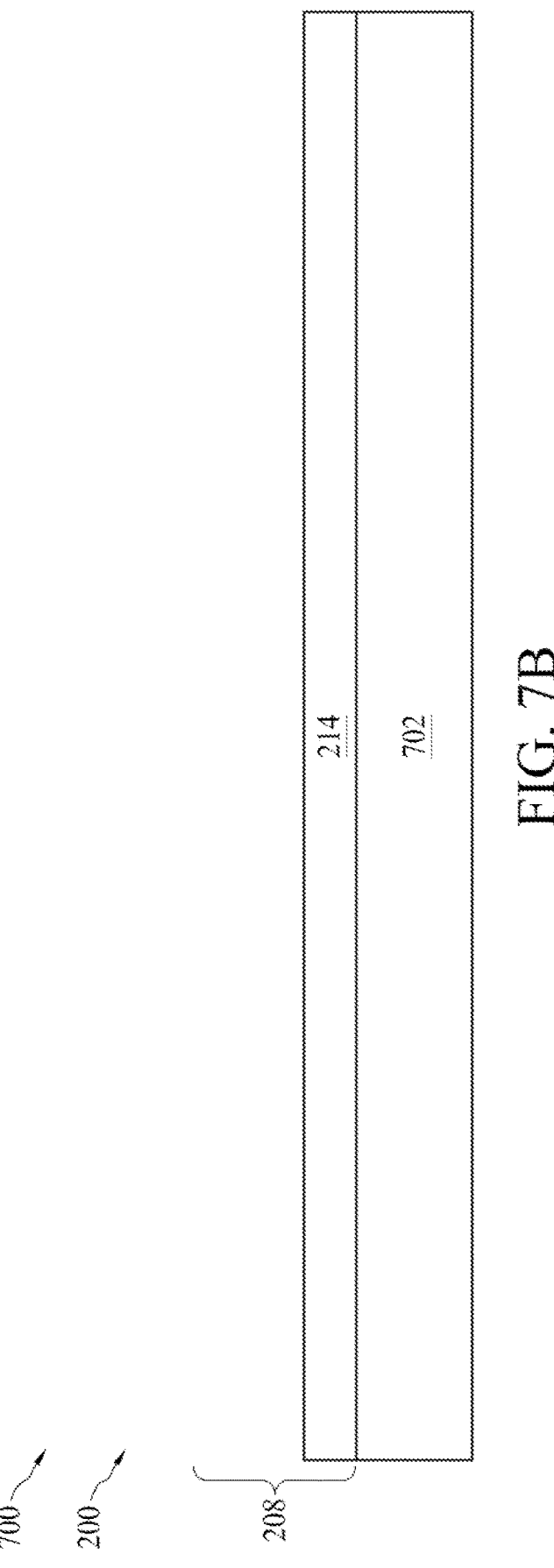

As shown in FIG. 7B, a first layer (e.g., a first polymer layer) of the polymer layer 214 may be formed over and/or on the carrier substrate 702. The RDL tool set 105 may form the first layer of the polymer layer 214 by spin coating, lamination, CVD, and/or by performing another suitable deposition.

Figure 7C:
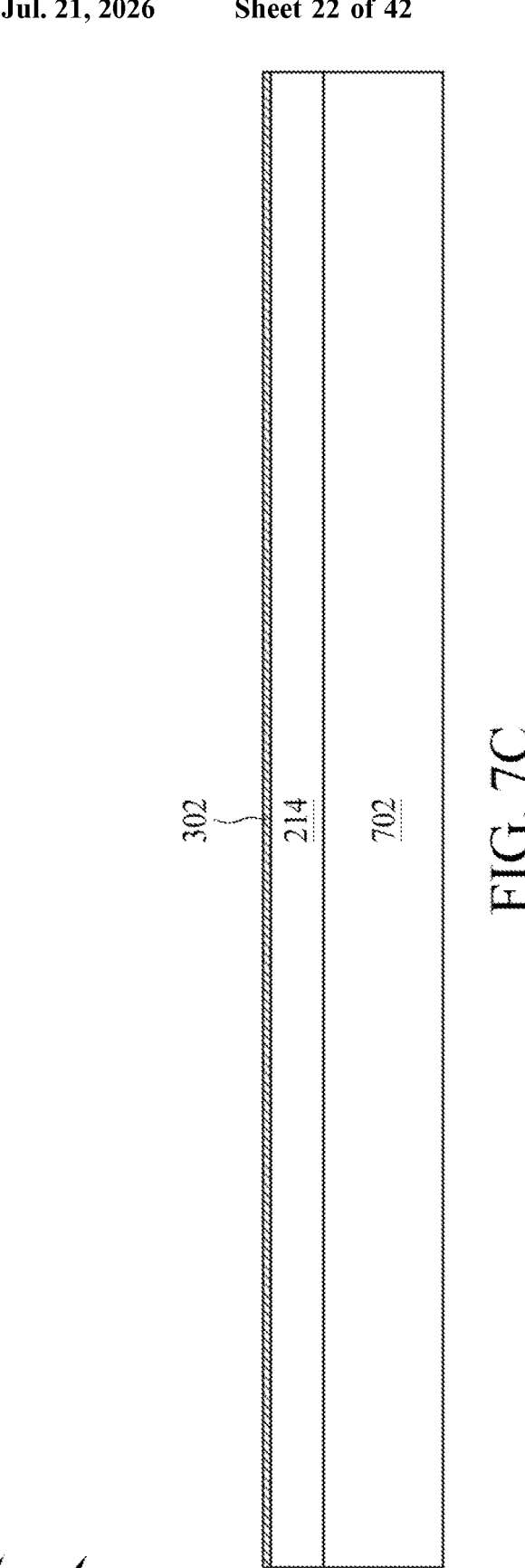

As shown in FIG. 7C, a seed layer 302 may be formed over and/or on the first layer of the polymer layer 214. The RDL tool set 105 may deposit the seed layer 302 by CVD, PVD (sputtering), plating (e.g., electroplating, electroless plating), and/or another suitable deposition technique.

Figure 7D:
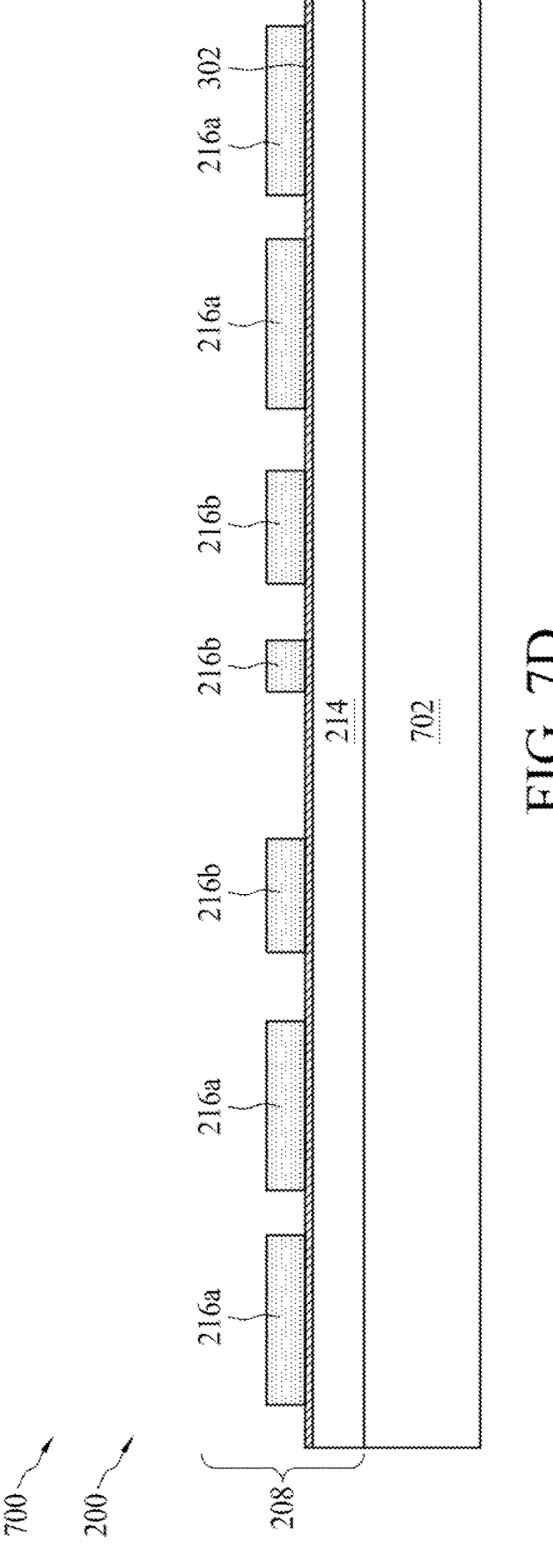

As shown in FIG. 7D, an RDL 216 may be formed over and/or on the seed layer 302 and over the first layer of the polymer layer 214. The RDL tool set 105 may form a photoresist on the seed layer 302 and may pattern the photoresist. The photoresist may be formed by spin coating or another suitable deposition technique and may be exposed to light for patterning. The patterning forms openings through the photoresist to expose the seed layer 302 through the photoresist. A conductive material may then be deposited through the openings of the photoresist and onto the exposed portions of the seed layer 302 to form the portions 216a and 216b of the RDL 216. The conductive material may be formed by plating, such as electroplating or electroless plating, PVD, CVD, and/or another suitable deposition technique.

Figure 7E:
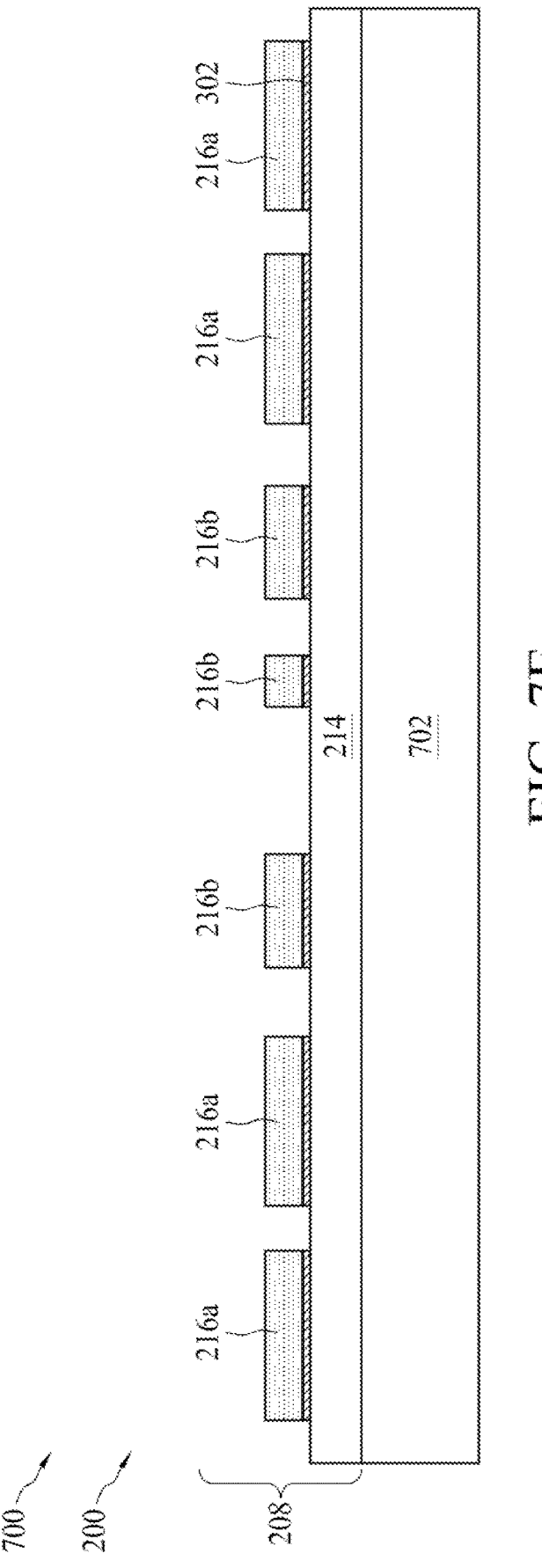

As shown in FIG. 7E, the photoresist and portions of the seed layer on which the conductive material is not formed may subsequently be removed. The RDL tool set 105 may remove the photoresist by an ashing or stripping process, such as using an oxygen plasma or another suitable chemical. Once the photoresist is removed, the RDL tool set 105 may remove exposed portions of the seed layer 302, such as by using an etching process, such as by wet or dry etching. Accordingly, portions of the seed layer 302 under the portions 216a and 216b of the RDL 216 remain.

Figure 7F:
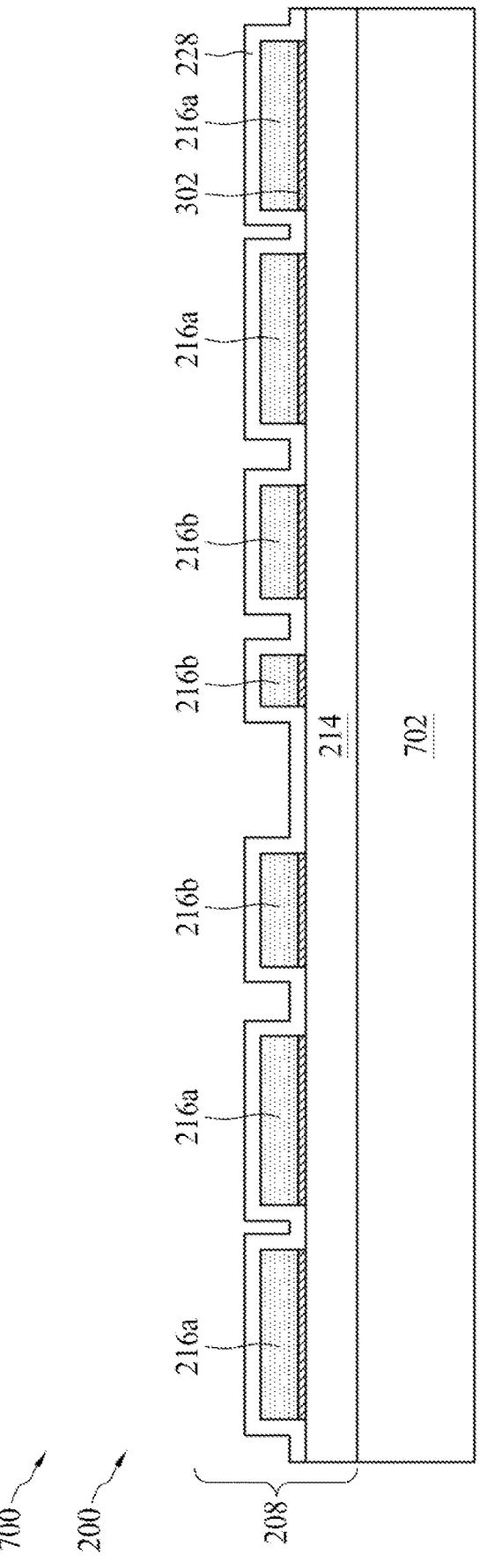

As shown in FIG. 7F, an adhesion layer 228 may be formed on the portions 216a and 216b of the RDL 216 and on the exposed portions of the first layer of the polymer layer 214. The RDL tool set 105 may deposit the adhesion layer 228 by CVD, PVD (sputtering), plating (e.g., electroplating, electroless plating), and/or another suitable deposition technique. In some implementations, the seed layer 302 and the adhesion layer 228 include the same material or the same combination of materials, such as titanium (Ti) and/or another suitable conductive material. In some implementations, the seed layer 302 and the adhesion layer 228 include different materials or a different combination of materials.

Figure 7G:
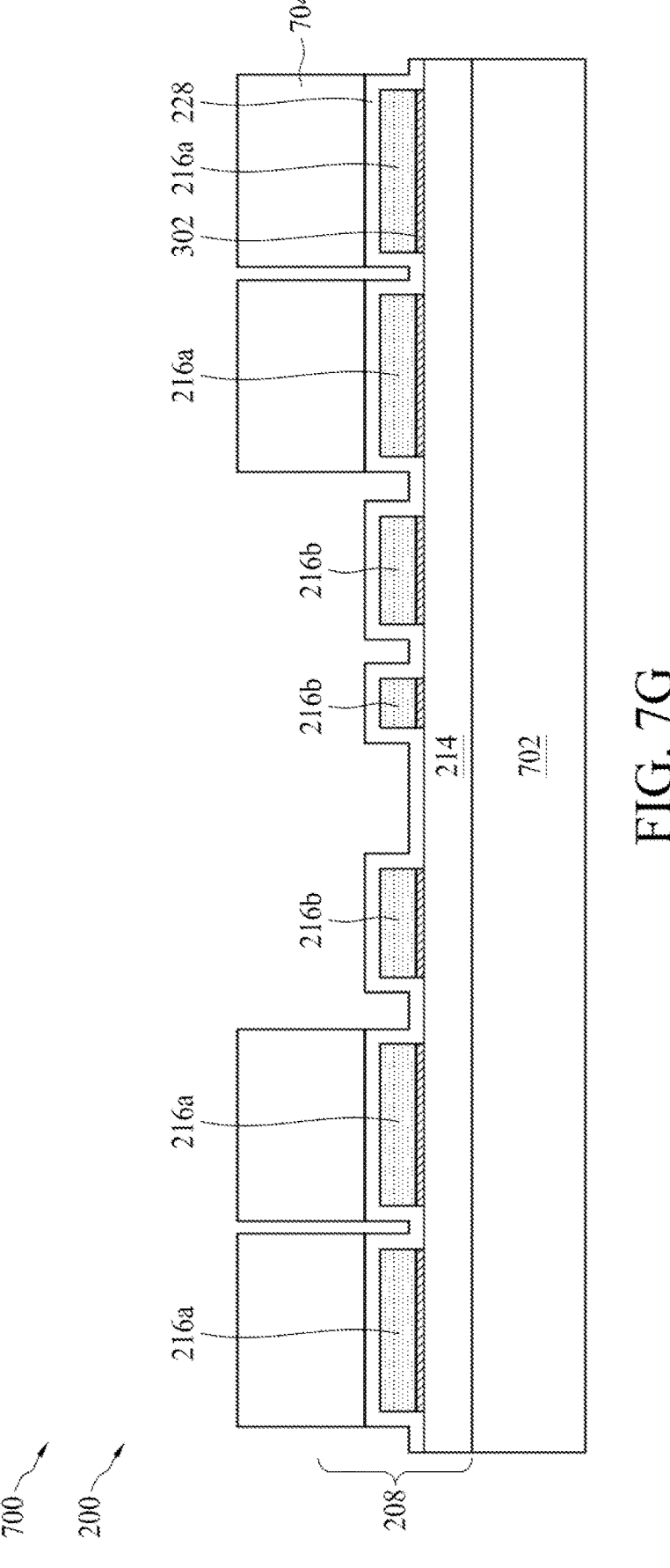
Figure 7H:
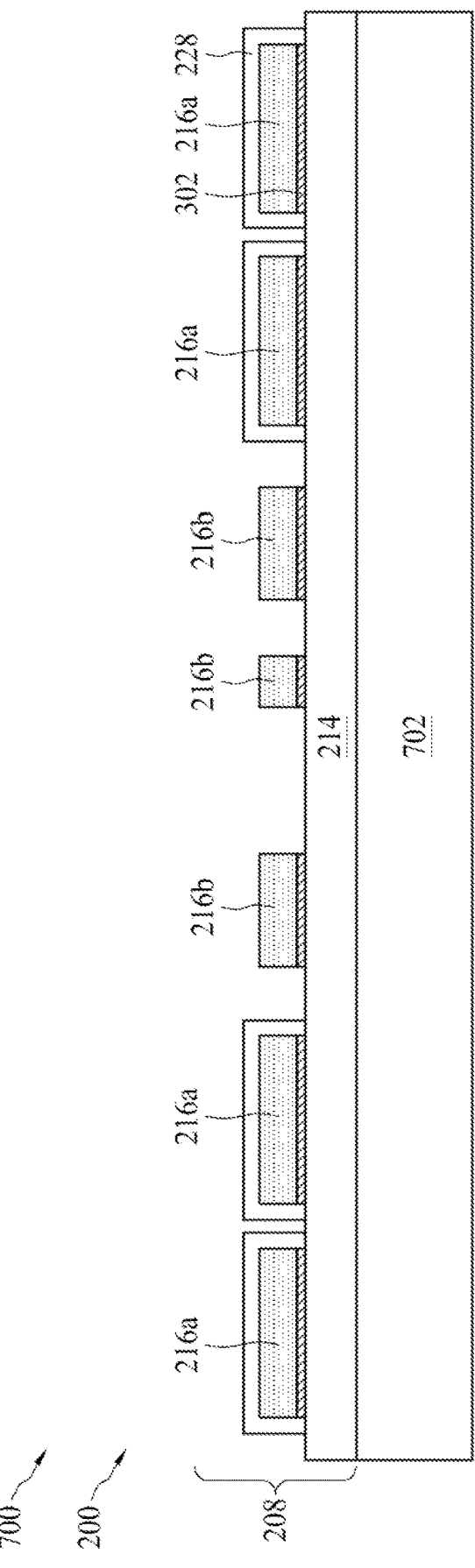
Figure 71:
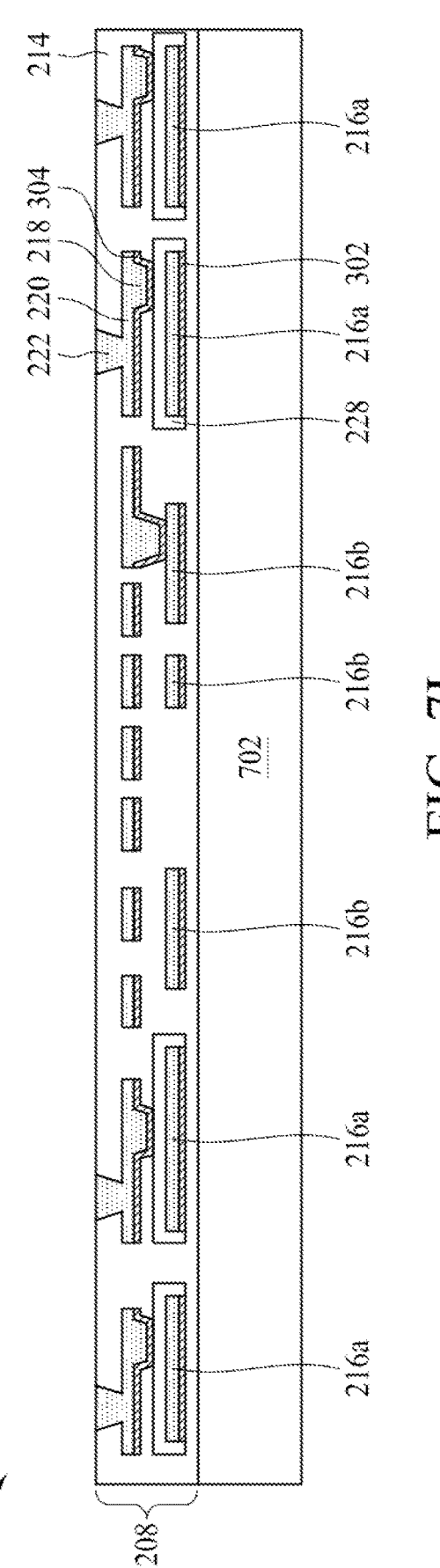

As shown in FIGS. 7G and 7H, portions of the adhesion layer 228 may be removed from the first layer of the polymer layer 214 and from the portions 216b of the RDL 216. The adhesion layer 228 remains on the portions 216a of the RDL 216 (e.g., on the top surfaces and sidewalls of the portions 216a), above which TIVs 224 are to be formed.

As shown in FIG. 7G, the RDL tool set 105 may form a photoresist 704 on the adhesion layer 228 and may pattern the photoresist 704 such that the photoresist 704 remains on the adhesion layer 228 that is over the portions 216a of the RDL 216 (e.g., the portions over which the adhesion layer 228 is to remain). The photoresist 704 may be formed by spin coating or another suitable deposition technique and may be exposed to light for patterning. The patterning forms openings through the photoresist 704 to expose the adhesion layer 228 through the photoresist 704. In particular, the portions of the adhesion layer 228 on the first layer of the polymer layer 214 and the portions of the adhesion layer 228 on the portions 216b of the RDL 216 are exposed through the openings in the photoresist 704.

As shown in FIG. 7H, once the photoresist 704 is patterned, the RDL tool set 105 may remove the exposed portions of the adhesion layer 228, such as by using an etching process, such as by wet or dry etching. Accordingly, the portions of the adhesion layer 228 under the remaining portions of the photoresist 704 remain on the portions 216a of the RDL 216.

As shown in FIG. 7I, one or more second polymer layers of the polymer layer 214 and one or more second RDLs of the redistribution structure 208 may be formed over the portions 216a and 216b of the RDL 216. The adhesion layer 228 is configured to promote adhesion between the portions 216a of the RDL 216 and the additional polymer layer(s) of the polymer layer 214. The RDL tool set 105 may form the one or more second polymer layers of the polymer layer 214 and one or more second RDLs of the redistribution structure 208 in a plurality of processing operations. For example, the RDL tool set 105 may deposit a second polymer layer of the polymer layer 214, may remove portions of the second polymer layer to form recesses in the second polymer layer, and may form via structures 218 and an RDL 220 in the recesses. In some implementations, the RDL tool set 105 may form a seed layer 304 in the recesses, and may then form the via structures 218 and the RDL 220 on the seed layer 304 in the recesses. The seed layer 302, the seed layer 304, and/or the adhesion layer 228 may include the same material(s) or different materials. The RDL tool set 105 may continue to perform similar processing operations to form the via structures 222 and to build the redistribution structure 208 until a sufficient or desired arrangement of metallization layers is achieved.

As indicated above, FIGS. 7A-7I are provided as an example. Other examples may differ from what is described with regard to FIGS. 7A-7I.

Figure 8:
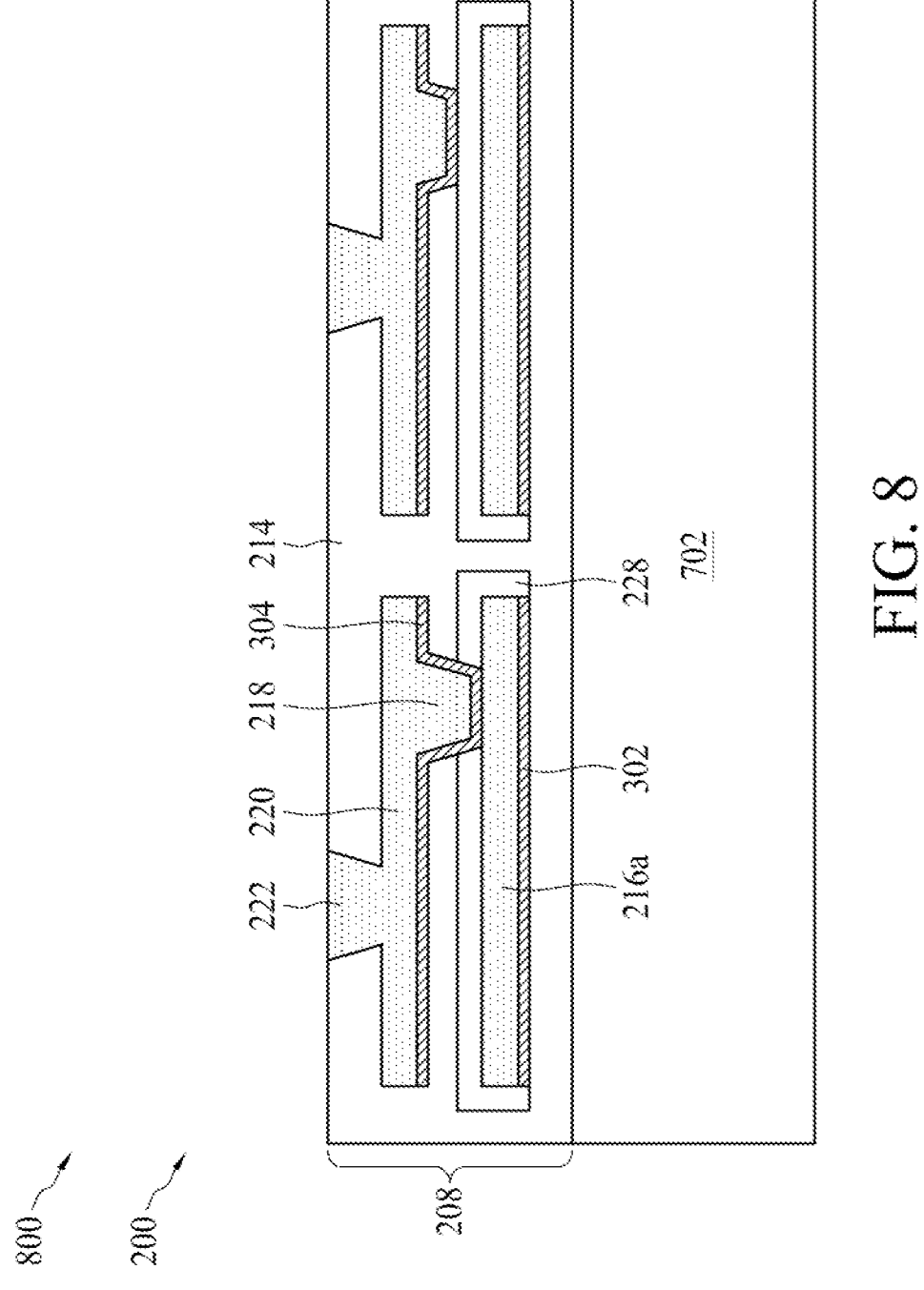
FIG. 8 is a diagram of an example implementation of a semiconductor device package described herein.

FIG. 8 is a diagram of an example implementation 800 of the semiconductor device package 200 described herein. In particular, the example implementation 800 includes an example of the semiconductor device package 200 in which a portion of the seed layer 304 is formed directly on a portion 216a of the RDL 216 as opposed to being formed on a portion of the adhesion layer 228. In some implementations, this may reduce contact resistance between the portion 216a of the RDL 216 and the associated via structure 218 and/or may reduce the thickness of the redistribution structure 208.

To form the configuration shown in FIG. 8, the RDL tool set 105 may remove a portion of the adhesion layer 228 from at least one of the portions 216a of the RDL 216 to expose a portion of the portion 216a of the RDL 216. The RDL tool set 105 may form the seed layer 304 directly on the exposed portion of the portion 216a of the RDL 216. The RDL tool set 105 may form a via structure 218 on the seed layer 304 that is directly on the portion 216a of the RDL 216.

As indicated above, FIG. 8 is provided as an example. Other examples may differ from what is described with regard to FIG. 8.

FIGS. 9A-9E are diagrams of an example implementation 900 described herein. In particular, the example implementation 900 includes an example of forming a portion of a semiconductor device package 200 described herein. In some implementations, the operations described in connection with FIGS. 9A-9E may be performed after one or more operations described in connection with FIGS. 6A-6J and/or FIGS. 7A-7I.

Figure 9A:
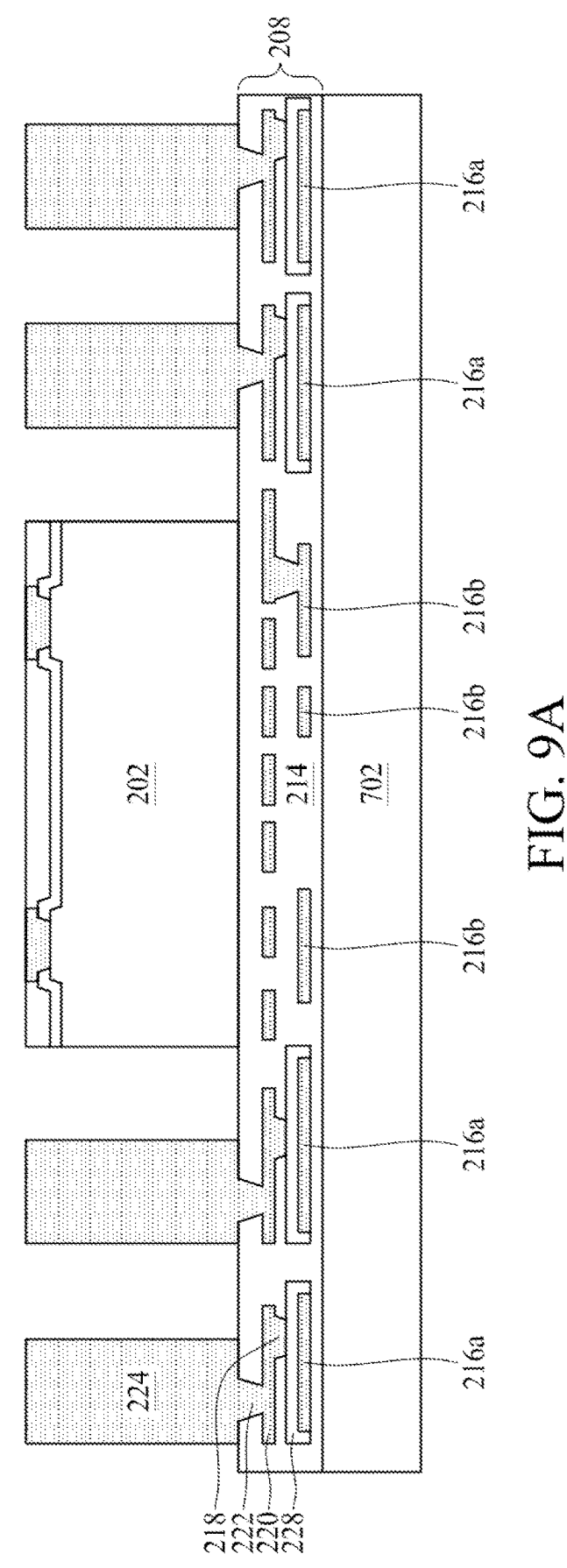
FIGS. 9A-9E are diagrams of an example implementation described herein.

As shown in FIG. 9A, TIVs 224 of the semiconductor device package 200 may be formed over and/or on the redistribution structure 208. In particular, the TIVs 224 may be formed such that the TIVs 224 are physically and/or electrically connected with the via structures 222 of the redistribution structure 208. Thus, the TIVs 224 may be formed to be electrically connected with the RDL 220 through the via structures 222.

The connection tool set 115 may form the TIVs 224. Forming the TIVs 224 may include a plurality of processing operations. A seed layer may be formed over and/or on the via structures 222. In some implementations, the seed layer includes a metal layer, which may be a single layer or a composite layer including a plurality of sub-layers formed of different materials. In some implementations, the seed layer includes a titanium (Ti) layer and a copper (Cu) layer over the titanium layer. The seed layer may be formed using, for example, PVD (sputtering), electroplating, CVD, and/or another suitable deposition technique.

After forming the seed layer, a photoresist may then be formed and patterned on the seed layer. The photoresist may be formed by spin coating or by performing another suitable deposition operation. The photoresist may be exposed to light for patterning. The patterning of the photoresist may be performed to form openings through the photoresist to expose the seed layer.

A conductive material may then be formed in the openings of the photoresist and on the exposed portions of the seed layer. The conductive material may be formed by plating, such as electroplating or electroless plating, or by performing another suitable deposition operation. In some implementations, the conductive material is formed in a conformal manner such that the conductive material partially fills the openings through the photoresist. The combination of the conductive material and underlying portions of the seed layer may correspond to the TIVs 224.

The photoresist and portions of the seed layer on which the conductive material is not formed may be subsequently removed. The photoresist may be removed in an ashing operation or a stripping operation. Once the photoresist is removed, exposed portions of the seed layer may be removed by etching process, such as by wet or dry etching such that the only remaining portions of the seed layer are under the TIVs 224.

As further shown in FIG. 9A, a semiconductor die package 202 (e.g., the semiconductor die package 202a, the semiconductor die package 202b) may be mounted on the redistribution structure 208 between the TIVs 224. In some implementations, die-attach tool set 130 may attach the semiconductor die package 202 to the polymer layer(s) 214 such that the semiconductor die(s) 502 of the semiconductor die package 202 are facing the redistribution structure 208, and such that the connectors 514 are facing away from the redistribution structure 208.

Figure 9B:

As shown in FIG. 9B, the encapsulation layer 226 may be formed over the redistribution structure 208. The encapsulation tool set 135 may deposit the molding compound of the encapsulation layer 226 around the TIVs 224 and around the semiconductor die package 202 such that the TIVs 224 and the semiconductor die package 202 are encapsulated and/or surrounded by the encapsulation layer 226. The encapsulation tool set 135 may deposit the encapsulation layer 226 by compression molding, transfer molding, or by another suitable technique. The molding compound of the encapsulation layer 226 may be applied in liquid or semi-liquid form and then subsequently cured.

Figure 9C:
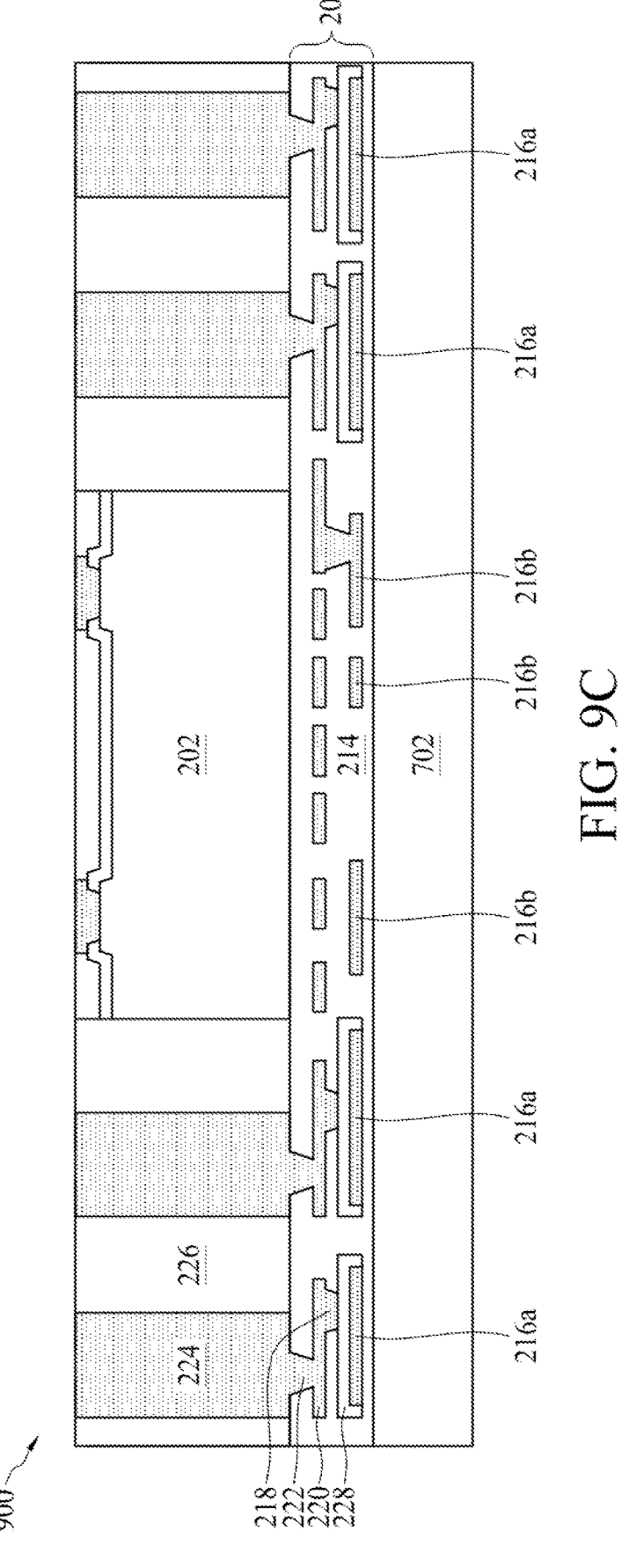

As shown in FIG. 9C, the planarization tool set 110 may perform a planarization operation to remove and planarize an upper surface of the encapsulation layer 226 that is formed over the tops of the TIVs 224 and/or over the top of the semiconductor die package 202. The planarization operation may include a CMP operation, a grinding operation, an etching operation, and/or another suitable process.

Figure 9D:
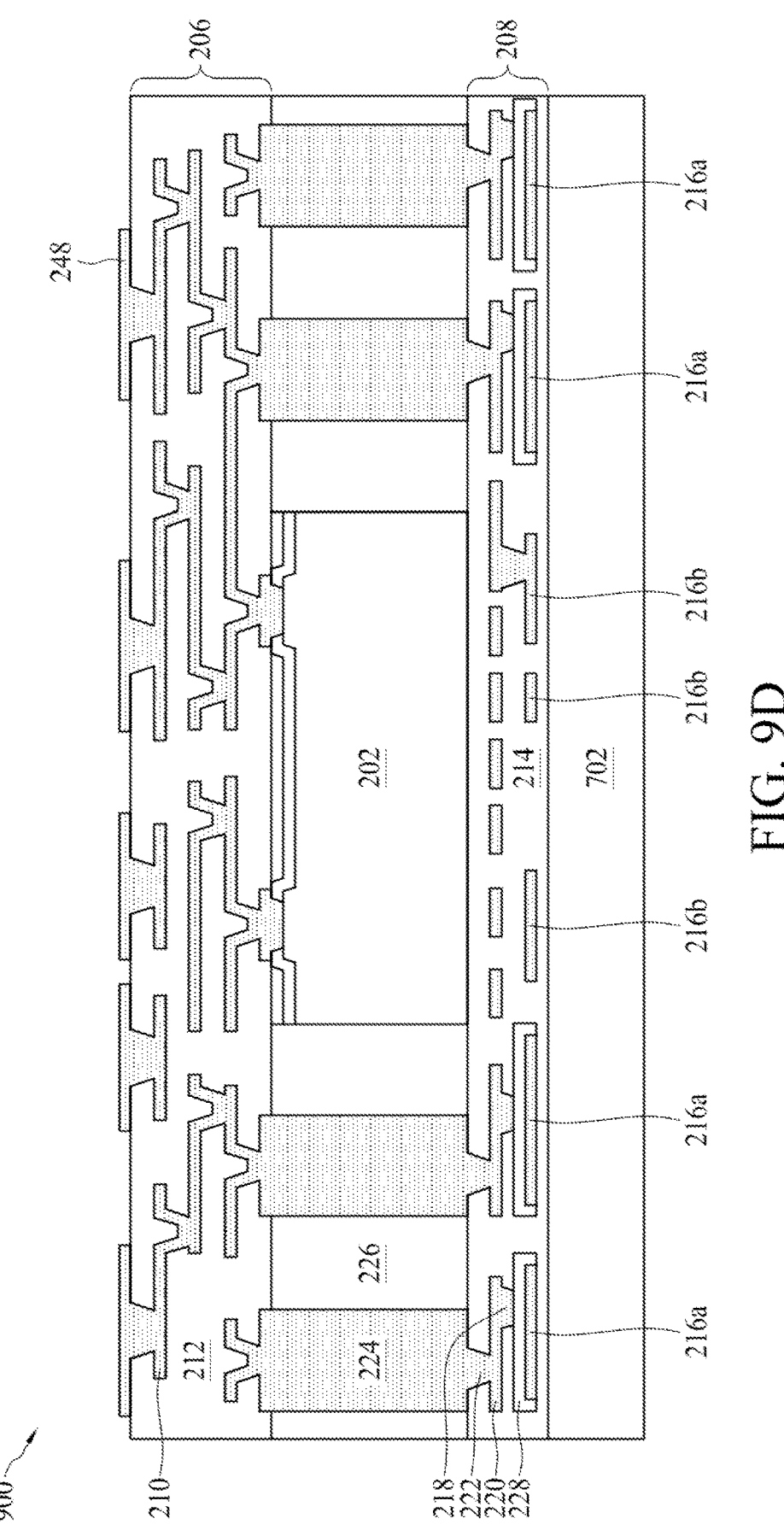

As shown in FIG. 9D, the redistribution structure 206 may be formed over and/or on the semiconductor die package 202, over and/or on the TIVs 224, and over and/or on the encapsulation layer 226. The RDL tool set 105 may form the redistribution structure 206 by forming a plurality of polymer layers 212 and a plurality of metallization layers 210 in the plurality of polymer layers 212. For example, the RDL tool set 105 may deposit a first polymer layer 212, may remove portions of the first polymer layer 212 to form recesses in the first polymer layer 212, and may form a first metallization layer 210 in the recesses. The RDL tool set 105 may continue to perform similar processing operations to build the redistribution structure 206 until a sufficient or desired arrangement of metallization layers 210 is achieved. The RDL tool set 105 may form conductive pads 248 on a topmost metallization layer 210.

Figure 9E:

As shown in FIG. 9E, conductive terminals 246 may be formed over and/or on the redistribution structure 206. The connection tool set 115 may form the conductive terminals 246 on the conductive pads 248. Moreover, an IPD 238 may be attached to the redistribution structure 206 by bonding pads 240 and connectors 242, and the gaps between the bonding pads 240 and the connectors 242 may be filled in with an underfill material 244.

As indicated above, FIGS. 9A-9E are provided as an example. Other examples may differ from what is described with regard to FIGS. 9A-9E.

FIGS. 10A-10F are diagrams of an example implementation 1000 described herein. In particular, the example implementation 1000 includes an example of forming a portion of a semiconductor device package 200 described herein. In some implementations, the operations described in connection with FIGS. 10A-10F may be performed after one or more operations described in connection with FIGS. 6A-6J, FIGS. 7A-7I, and/or FIGS. 9A-9E.

Figure 10A:
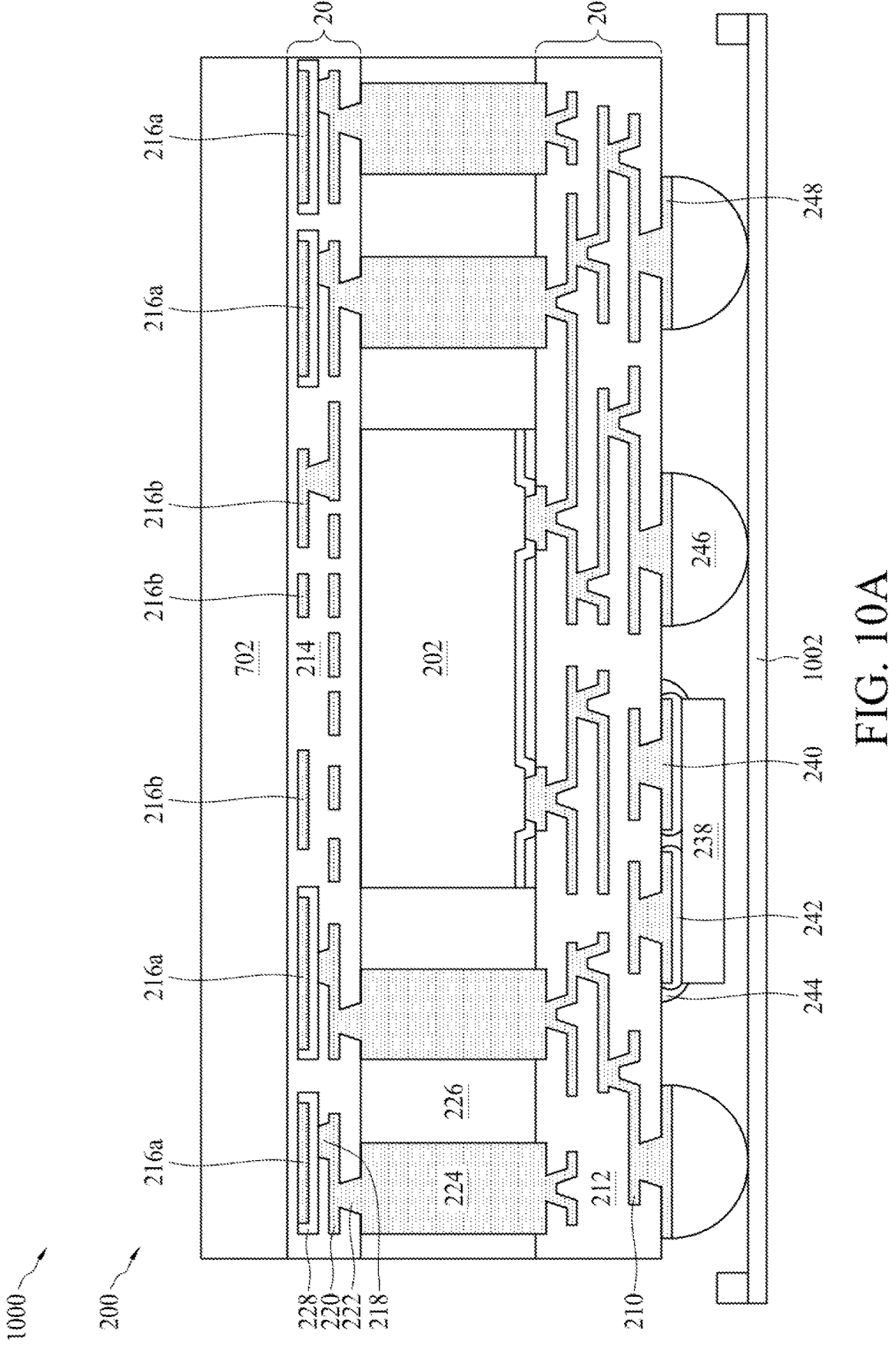
FIGS. 10A-10F are diagrams of an example implementation described herein.

As shown in FIG. 10A, the semiconductor device package 200 may be placed on a frame 1002. The frame 1002 may be referred to as a tape frame or another type of frame that supports the semiconductor device package 200 during processing. In some implementations, a plurality of semiconductor device packages 200 are formed on the carrier substrate 702 and subsequently placed on the frame 1002 for processing. In these implementations, the frame 1002 may also support the semiconductor device packages 200 during singulation to cut the semiconductor device packages 200 into individual pieces after processing.

Figure 10B:
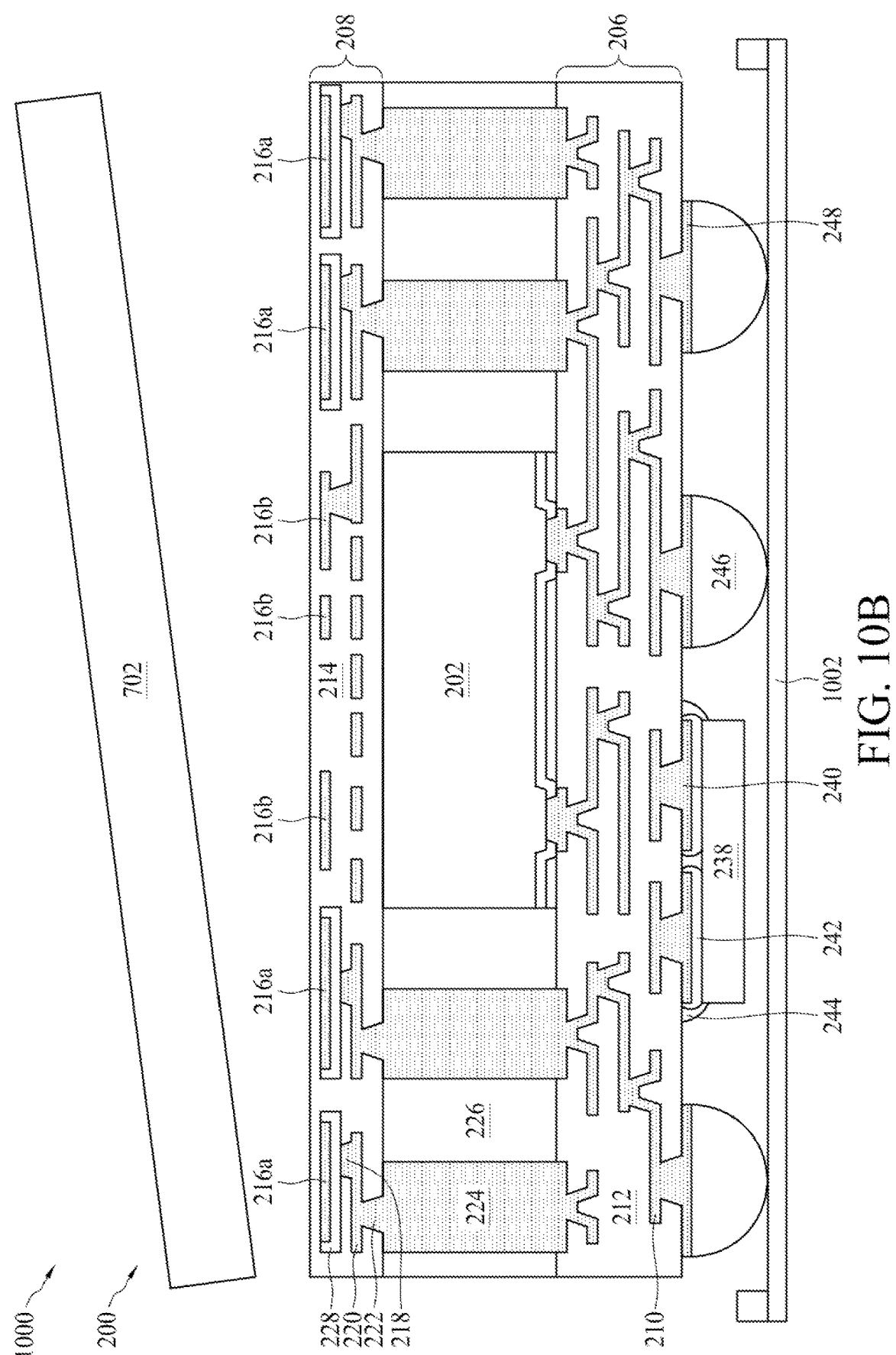

As shown in FIG. 10B, carrier substrate de-bonding is performed to detach (or "de-bond") the carrier substrate 702 from the semiconductor device package 200. The carrier substrate 702 may be removed from the first side (e.g., the top side) of the redistribution structure 208. The singulation tool set 125 may de-bond the carrier substrate 702 using one or more techniques, such as projecting a light (e.g., a laser light or an UV light) onto an LTHC release layer between the carrier substrate 702 and the semiconductor device package 200 so that the LTHC release layer decomposes under the heat of the light. This enables the carrier substrate 702 to be removed from the semiconductor device package 200. In some implementations, an adhesion layer is also removed from the semiconductor device package 200. In some implementations, the adhesion layer remains on the semiconductor device package 200.

Figure 10C:
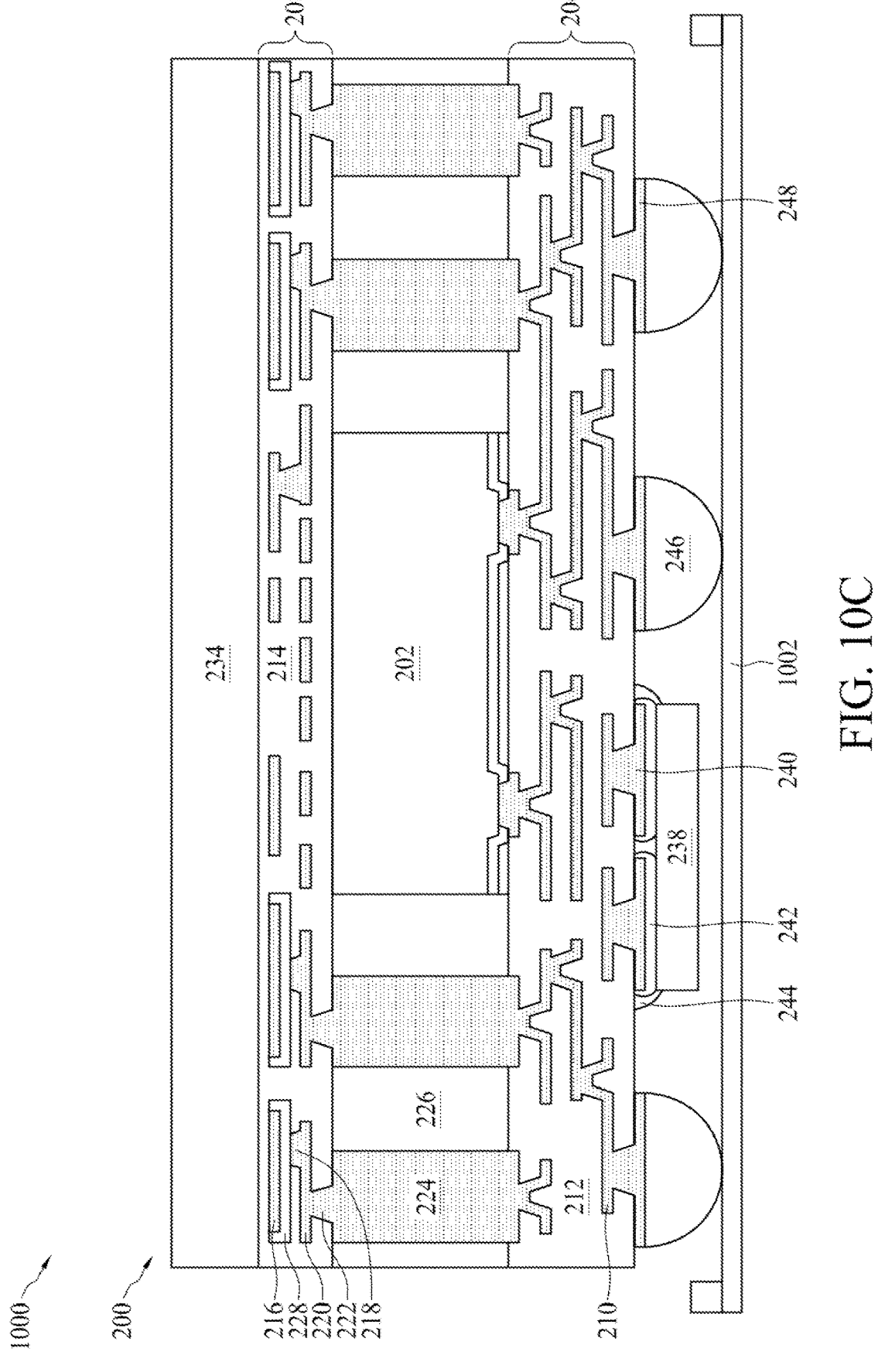

As shown in FIG. 10C, the RDL tool set 105 may attach a BEL film 234 to the first side (e.g., the top side) of the redistribution structure 208. The RDL tool set 105 may laminate the BEL film 234 to the first side of the redistribution structure 208 and/or may attach the BEL film 234 to the first side of the redistribution structure 208 using another technique.

Figure 10D:
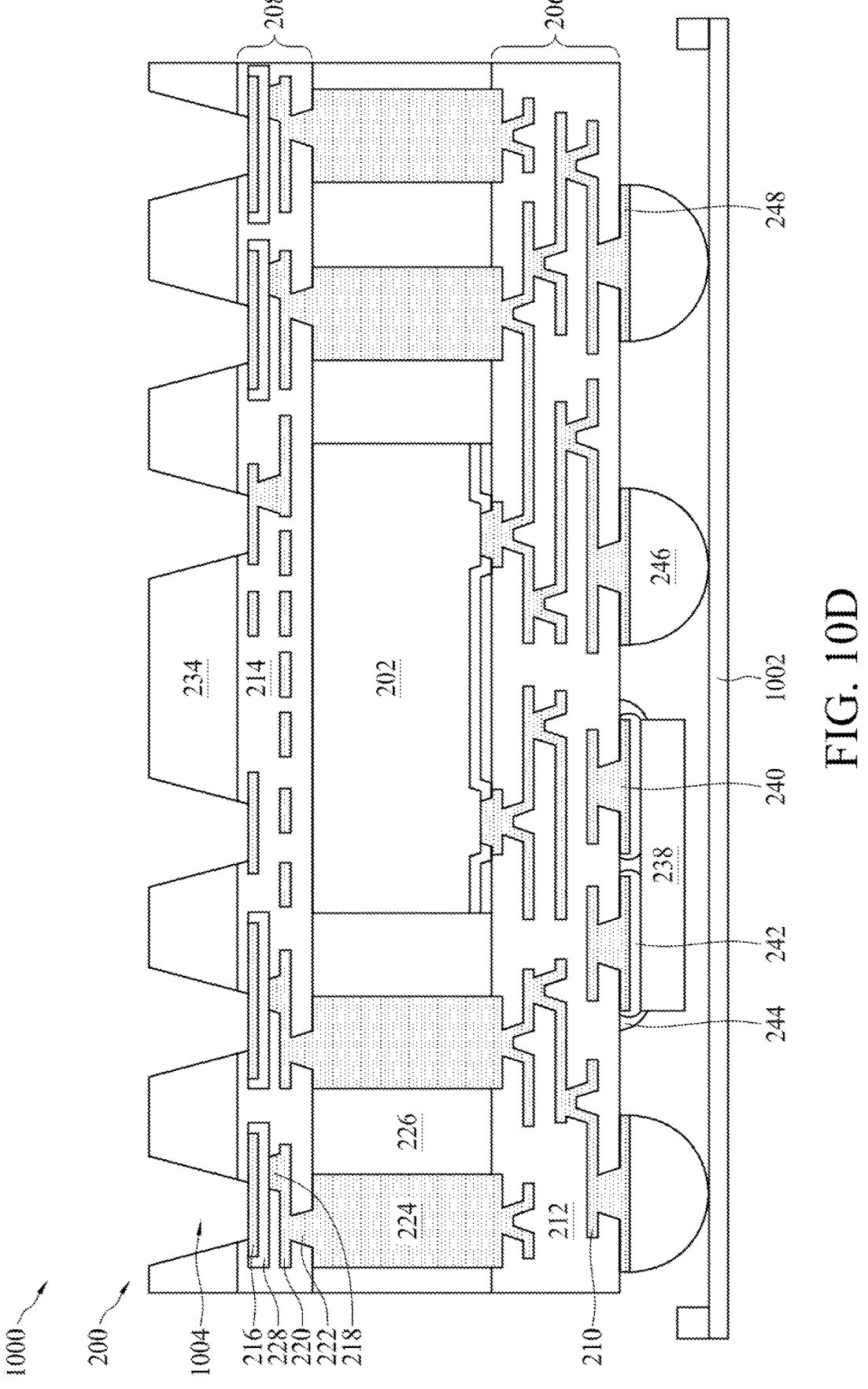

As shown in FIG. 10D, the singulation tool set 125 may perform a laser drilling operation and/or another type of operation to form openings 1004 in the BEL film 234 to expose portions of the RDL 216 through the openings 1004. In some implementations, the openings 1004 may be formed through a portion of the adhesion layer 228 to expose portions of the RDL 216 through the openings 1004.

Figure 10E:
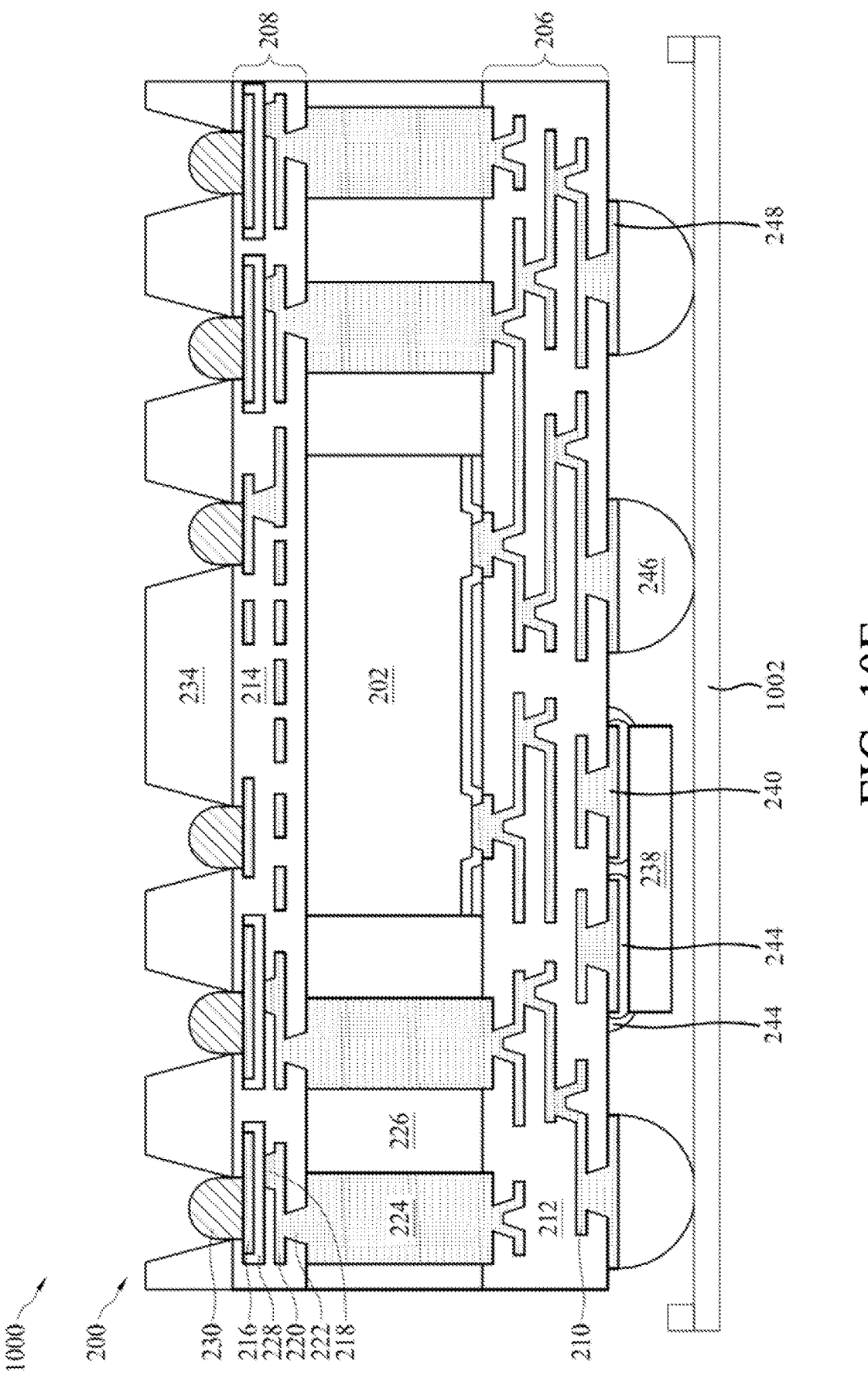

As shown in FIG. 10E, connectors 230 may be formed in the openings 1004 such that the connectors 230 are attached to the RDL 216. For example, the connection tool set 115 may form the connectors 230 in the openings 1004. The semiconductor device package 200 may be subsequently removed from the frame 1002.

Figure 10F:
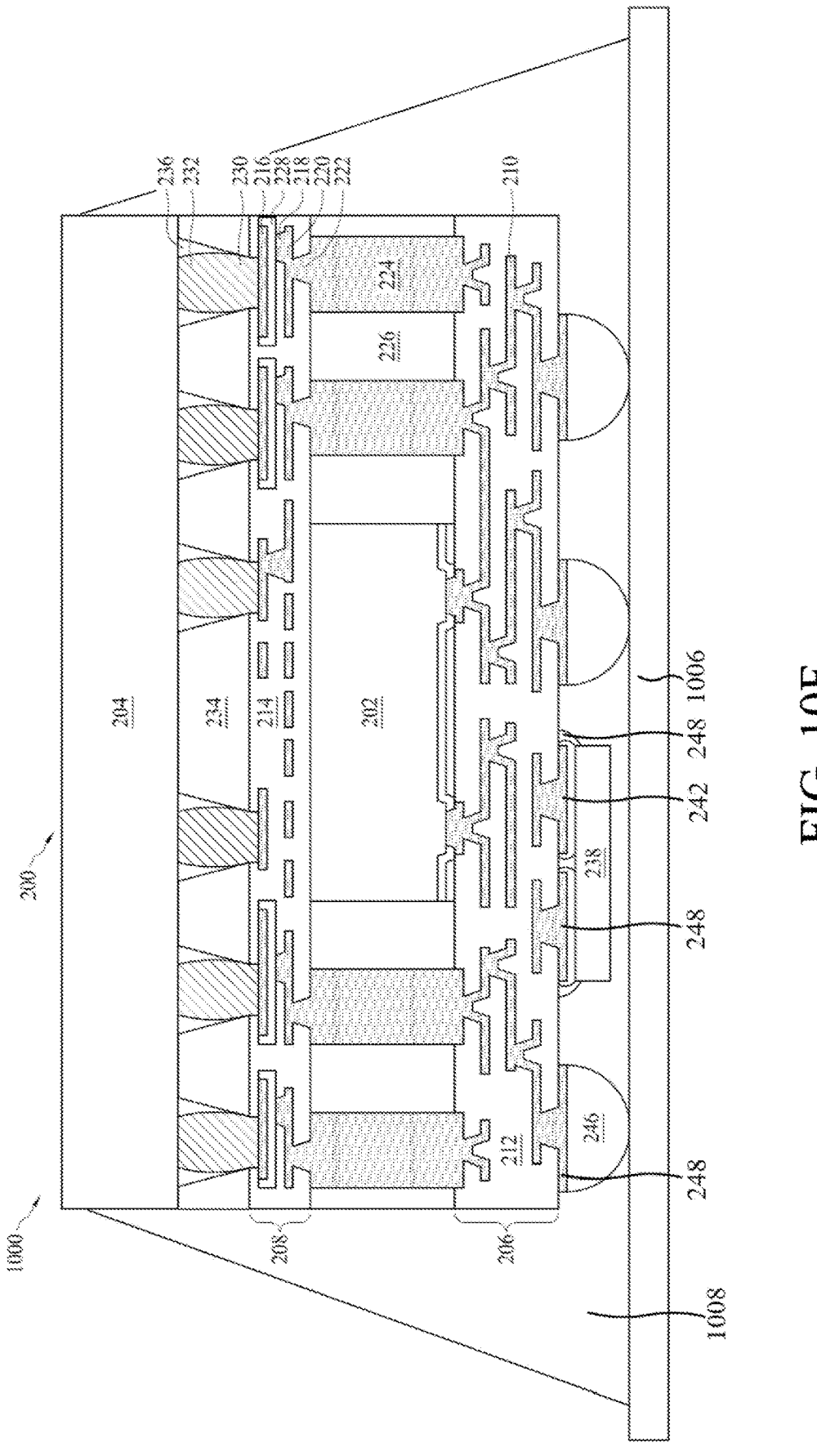

As shown in FIG. 10F, the semiconductor die package 204 may be attached to the redistribution structure 208, and an underfill material 236 may be dispensed under the semiconductor die package 204 and between the semiconductor die package 204 and the redistribution structure 208. Alternatively, the operations that are illustrated and described in connection with FIG. 10F are omitted, and the semiconductor device package 200 is prepared for finishing at a subsequent manufacturer or end user. At the end user, the semiconductor device package 200 may be attached to a PCB 1006, and an underfill 1008 may be dispensed around the semiconductor device package 200.

The die-attach tool set 130 may attach the semiconductor die package 204 to the redistribution structure 208 by placing the bottom connection structures 232 of the semiconductor die package 204 on the connectors 230 and performing a reflow operation to cause the connectors 230 to bond with the bottom connection structures 232. In some implementations, a solder paste may be placed on the tops of the connectors 230 in preparation for attaching the semiconductor die package 204 to the connectors 230.

The encapsulation tool set 135 may deposit the underfill material 236 in a capillary flow process, in which the capillary effect is used to deposit the underfill material 236 in between the semiconductor die package 204 and the BEL film 234. Alternatively, another suitable technique may be used to deposit the underfill material 236.

As indicated above, FIGS. 10A-10F are provided as an example. Other examples may differ from what is described with regard to FIGS. 10A-10F.

Figure 11:
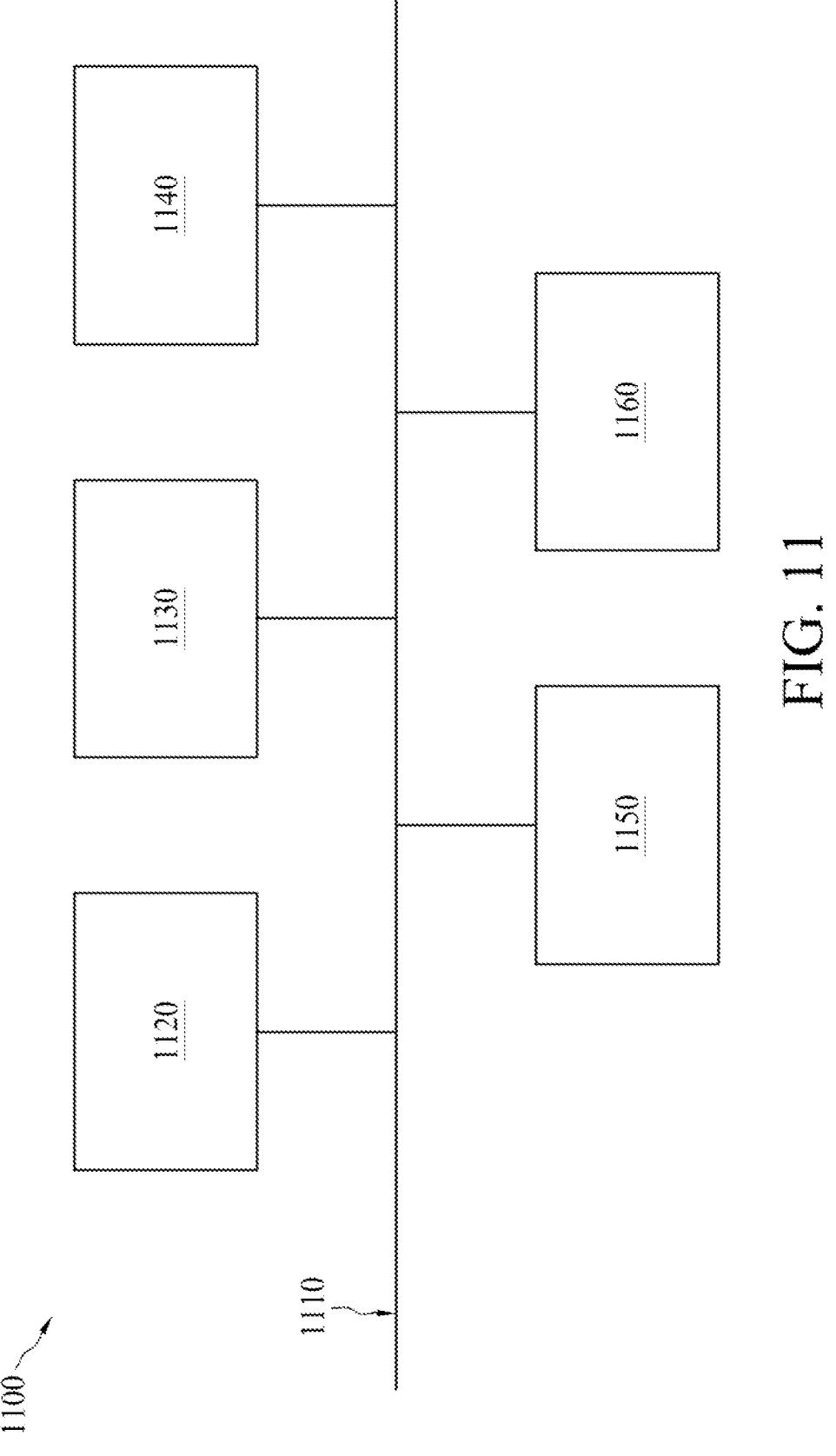
FIG. 11 is a diagram of example components of a device described herein.

FIG. 11 is a diagram of example components of a device 1100 described herein. In some implementations, one or more of the semiconductor processing tool sets 105-150 and/or the transport tool set 155 may include one or more devices 1100 and/or one or more components of device 1100. As shown in FIG. 11, device 1100 may include a bus 1110, a processor 1120, a memory 1130, an input component 1140, an output component 1150, and a communication component 1160.

Bus 1110 may include one or more components that enable wired and/or wireless communication among the components of device 1100. Bus 1110 may couple together two or more components of FIG. 11, such as via operative coupling, communicative coupling, electronic coupling, and/or electric coupling. Processor 1120 may include a central processing unit, a graphics processing unit, a microprocessor, a controller, a microcontroller, a digital signal processor, a field-programmable gate array, an application-specific integrated circuit, and/or another type of processing component. Processor 1120 is implemented in hardware, firmware, or a combination of hardware and software. In some implementations, processor 1120 may include one or more processors capable of being programmed to perform one or more operations or processes described elsewhere herein.

Memory 1130 may include volatile and/or nonvolatile memory. For example, memory 1130 may include random access memory (RAM), read only memory (ROM), a hard disk drive, and/or another type of memory (e.g., a flash memory, a magnetic memory, and/or an optical memory). Memory 1130 may include internal memory (e.g., RAM, ROM, or a hard disk drive) and/or removable memory (e.g., removable via a universal serial bus connection). Memory 1130 may be a non-transitory computer-readable medium. Memory 1130 stores information, instructions, and/or software (e.g., one or more software applications) related to the operation of device 1100. In some implementations, memory 1130 may include one or more memories that are coupled to one or more processors (e.g., processor 1120), such as via bus 1110.

Input component 1140 enables device 1100 to receive input, such as user input and/or sensed input. For example, input component 1140 may include a touch screen, a keyboard, a keypad, a mouse, a button, a microphone, a switch, a sensor, a global positioning system sensor, an accelerometer, a gyroscope, and/or an actuator. Output component 1150 enables device 1100 to provide output, such as via a display, a speaker, and/or a light-emitting diode. Communication component 1160 enables device 1100 to communicate with other devices via a wired connection and/or a wireless connection. For example, communication component 1160 may include a receiver, a transmitter, a transceiver, a modem, a network interface card, and/or an antenna.

Device 1100 may perform one or more operations or processes described herein. For example, a non-transitory computer-readable medium (e.g., memory 1130) may store a set of instructions (e.g., one or more instructions or code) for execution by processor 1120. Processor 1120 may execute the set of instructions to perform one or more operations or processes described herein. In some implementations, execution of the set of instructions, by one or more processors 1120, causes the one or more processors 1120 and/or the device 1100 to perform one or more operations or processes described herein. In some implementations, hardwired circuitry is used instead of or in combination with the instructions to perform one or more operations or processes described herein. Additionally, or alternatively, processor 1120 may be configured to perform one or more operations or processes described herein. Thus, implementations described herein are not limited to any specific combination of hardware circuitry and software.

The number and arrangement of components shown in FIG. 11 are provided as an example. Device 1100 may include additional components, fewer components, different components, or differently arranged components than those shown in FIG. 11. Additionally, or alternatively, a set of components (e.g., one or more components) of device 1100 may perform one or more functions described as being performed by another set of components of device 1100.

FIG. 12 is a flowchart of an example process 1200 associated with forming a semiconductor device package. In some implementations, one or more process blocks of FIG. 12 are performed by one or more semiconductor processing tool sets (e.g., one or more of the semiconductor processing tool sets 105-150). Additionally, or alternatively, one or more process blocks of FIG. 12 may be performed by one or more components of device 1100, such as processor 1120, memory 1130, input component 1140, output component 1150, and/or communication component 1160.

As shown in FIG. 12, process 1200 may include forming, over a carrier substrate, a first polymer layer of a redistribution structure (block 1210). For example, one or more of the semiconductor processing tool sets 105-150 may form, over a carrier substrate 702, a first polymer layer 214 of a redistribution structure 208, as described above.

As further shown in FIG. 12, process 1200 may include forming, over the first polymer layer, a first RDL of the redistribution structure (block 1220). For example, one or more of the semiconductor processing tool sets 105-150 may form, over the first polymer layer 214, a first RDL 216 of the redistribution structure 208, as described above.

As further shown in FIG. 12, process 1200 may include forming an adhesion layer over the first polymer layer and on the first RDL (block 1230). For example, one or more of the semiconductor processing tool sets 105-150 may form an adhesion layer 228 over the first polymer layer 214 and on the first RDL 216, as described above.

As further shown in FIG. 12, process 1200 may include removing the adhesion layer from first portions of the first RDL (block 1240). For example, one or more of the semiconductor processing tool sets 105-150 may remove the adhesion layer 228 from first portions 216b of the first RDL 216, as described above. In some implementations, the adhesion layer 228 remains on second portions 216a of the first RDL 216.

As further shown in FIG. 12, process 1200 may include forming, above the first RDL, one or more second polymer layers and one or more second RDLs of the redistribution structure (block 1250). For example, one or more of the semiconductor processing tool sets 105-150 may form, above the first RDL 216, one or more second polymer layers 214 and one or more second RDLs 220 of the redistribution structure 208, as described above.

As further shown in FIG. 12, process 1200 may include forming a plurality of TIVs on the redistribution structure (block 1260). For example, one or more of the semiconductor processing tool sets 105-150 may form a plurality of TIVs 224 on the redistribution structure 208, as described above. In some implementations, the plurality of TIVs 224 are connected to at least one of the one or more second RDLs 220.

Process 1200 may include additional implementations, such as any single implementation or any combination of implementations described below and/or in connection with one or more other processes described elsewhere herein.

In a first implementation, the second portions 216a of the first RDL 216 are under the plurality of TIVs 224. In a second implementation, alone or in combination with the first implementation, process 1200 includes forming a seed layer 302 on the first polymer layer 214, and forming the first RDL 216 on the seed layer 302, where the adhesion layer 228 and the seed layer 302 encapsulate the second portions 216a of the first RDL 216. In a third implementation, alone or in combination with one or more of the first and second implementations, process 1200 includes forming another seed layer 304 on a portion of the adhesion layer 228 of at least one of the second portions 216a of the first RDL 216, and forming a via structure 218 on the seed layer 304 that is over the at least one of the second portions 216a of the first RDL 216.

In a fourth implementation, alone or in combination with one or more of the first through third implementations, process 1200 includes removing a portion of the adhesion layer 228 from at least one of the second portions 216a of the first RDL 216 to expose a portion of the at least one of the second portions 216a of the first RDL 216, forming another seed layer 304 on the exposed portion of the at least one of the second portions 216a of the first RDL, and forming a via structure 218 on the seed layer 304 that is on the at least one of the second portions 216a of the first RDL 216.

In a fifth implementation, alone or in combination with one or more of the first through fourth implementations, the adhesion layer 228 includes titanium (Ti). In a sixth implementation, alone or in combination with one or more of the first through fifth implementations, forming the one or more second polymer layers 214 includes forming a polymer layer 214 of the one or more polymer layers 214 on the adhesion layer 228, where the adhesion layer 228 is configured to promote adhesion between the second portions 216a of the first RDL 216 and the polymer layer 214. In a seventh implementation, alone or in combination with one or more of the first through sixth implementations, process 1200 includes removing the adhesion layer 228 from the first polymer layer 214 prior to forming the one or more second polymer layers 214 and the one or more second RDLs 220 of the redistribution structure 208.

Although FIG. 12 shows example blocks of process 1200, in some implementations, process 1200 includes additional blocks, fewer blocks, different blocks, or differently arranged blocks than those depicted in FIG. 12. Additionally, or alternatively, two or more of the blocks of process 1200 may be performed in parallel.

In this way, an adhesion layer may be formed over portions of an RDL in a redistribution structure of a semiconductor device package. The portions of the RDL over which the adhesion layer is formed may be located in the shadow of (e.g., under and/or over) one or more TIVs that are connected with the redistribution layer structure. The adhesion layer, along with a seed layer on which the portions of the RDL are formed, encapsulate the portions of the RDL in the shadow of the one or more TIVs, which promotes and/or increases adhesion between the portions of the RDL and the polymer layers of the redistribution structure. The increased adhesion reduces the likelihood of delamination between the RDL and the polymer layers of the redistribution structure that might otherwise occur from physical stress being transferred to the RDL due to thermal expansion of the one or more TIVs. This may reduce the likelihood of electrical shorting in the redistribution structure, which may reduce the likelihood of failures in the semiconductor device package and may increase semiconductor device package yield, among other examples.

As described in greater detail above, some implementations described herein provide a semiconductor device package. The semiconductor device package includes a redistribution structure that includes one or more dielectric layers and a plurality of metallization layers, included in the one or more dielectric layers. The semiconductor device package includes a plurality of interconnect structures extending below a first side of the redistribution structure, where the plurality of interconnect structures are connected to a first metallization layer of the redistribution structure at the first side, where a portion of a second metallization layer, over an interconnect structure of the plurality of interconnect structures, is surrounded by an adhesion layer between the portion of the second metallization layer and the one or more dielectric layers, and where the portion of the second metallization layer is at a second side of the redistribution structure opposing the first side. The semiconductor device package includes a semiconductor die package below the first side of the redistribution structure.

As described in greater detail above, some implementations described herein provide a method. The method includes forming, over a carrier substrate, a first polymer layer of a redistribution structure. The method includes forming, over the first polymer layer, a first RDL of the redistribution structure. The method includes forming an adhesion layer over the first polymer layer and on the first RDL. The method includes removing the adhesion layer from first portions of the first RDL, where the adhesion layer remains on second portions of the first RDL. The method includes forming, above the first RDL, one or more second polymer layers and one or more second RDLs of the redistribution structure. The method includes forming a plurality of TIVs on the redistribution structure, where the plurality of TIVs are connected to at least one of the one or more second RDLs.

As described in greater detail above, some implementations described herein provide a semiconductor device package. The semiconductor device package includes a first redistribution structure. The semiconductor device package includes a second redistribution structure. The semiconductor device package includes a semiconductor die package, between the first redistribution structure and the second redistribution structure, connected with the first redistribution structure. The semiconductor device package includes a plurality of TIVs adjacent to one or more sides of the semiconductor die package, where the plurality of TIVs extend between the first redistribution structure and a first side of the second redistribution structure. A plurality of TIVs extend between the first redistribution structure and a first side of the second redistribution structure. Portions of a redistribution layer (RDL) of the second redistribution structure on a second side of the second redistribution structure opposing the first side, that are over the plurality of TIVs, are surrounded by a layer that includes titanium (Ti).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device package, comprising:
a redistribution structure comprising one or more dielectric layers including a plurality of metallization layers;
a plurality of interconnect structures connected to a first metallization layer, of the plurality of metallization layers and at a first side of the redistribution structure, wherein a first portion, of a second metallization layer of the plurality of metallization layers and that is over an entirety of an interconnect structure of the plurality of interconnect structures, is surrounded by an adhesion layer between the first portion of the second metallization layer and the one or more dielectric layers,
wherein the first portion of the second metallization layer is at a second side of the redistribution structure opposing the first side; and
a semiconductor die package below the first side of the redistribution structure,
wherein the adhesion layer is omitted from a second portion, of the second metallization layer, that is over the semiconductor die package.

2. The semiconductor device package of claim 1, wherein the first portion of the second metallization layer extends laterally outward from a perimeter of the interconnect structure such that the adhesion layer that surrounds the first portion of the second metallization layer extends laterally outward from the perimeter of the interconnect structure.

3. The semiconductor device package of claim 1, wherein the second metallization layer is a topmost redistribution layer (RDL) layer in the redistribution structure; and
wherein the first metallization layer is a bottommost RDL layer in the redistribution structure.

4. The semiconductor device package of claim 1, wherein the second portion of the second metallization layer is in direct contact with the one or more dielectric layers.

5. The semiconductor device package of claim 1, wherein the plurality of interconnect structures are located in a through insulator via (TIV) region of the semiconductor device package; and
wherein the first portion of the second metallization layer is included in the TIV region of the semiconductor device package.

6. The semiconductor device package of claim 1, wherein the adhesion layer is included between the first portion of the second metallization layer and a seed layer of a via structure; and
wherein the via structure is included between the interconnect structure and the first portion of the second metallization layer.

7. The semiconductor device package of claim 6, wherein the adhesion layer and the seed layer include a same material.

8. A semiconductor device package, comprising:
a first redistribution structure;
a second redistribution structure comprises a redistribution layer (RDL) at a first side of the second redistribution structure;
a semiconductor die package, between the first redistribution structure and the second redistribution structure, connected with the first redistribution structure; and
a plurality of through insulator vias (TIVs) extending between the first redistribution structure and a second side of the second redistribution structure opposing the first side,
wherein a first portion of the RDL is over the plurality of TIVs and surrounded by a titanium layer, wherein the titanium layer is omitted from a second portion of the RDL.

9. The semiconductor device package of claim 8, further comprising:
a backside enhance layer (BEL) film above the second side of the second redistribution structure.

10. The semiconductor device package of claim 9, wherein the first portion of the RDL is connected with solder bumps that extend partially through the BEL film.

11. The semiconductor device package of claim 8, wherein subsets of the plurality of TIVs are included in respective TIV regions of the semiconductor device package; and wherein subsets of the first portion of the RDL are included in the respective TIV regions of the semiconductor device package.

12. The semiconductor device package of claim 8, wherein second portion of the RDL is in direct contact with a polymer layer of the second redistribution structure.

13. A semiconductor device package, comprising:

a redistribution structure, comprising:

a first polymer layer over a carrier substrate, a first redistribution layer (RDL) over the first polymer layer, an adhesion layer over the first polymer layer and on a first portion of the first RDL, wherein the adhesion layer is omitted from a second portion of the first RDL, one or more second polymer layers above the first RDL, and one or more second RDLs above the first RDL; and a plurality of through insulator vias (TIVs) on the redistribution structure, wherein the plurality of TIVs are connected to at least one of the one or more second RDLs.

14. The semiconductor device package of claim 13, wherein the first portion of the first RDL are under the plurality of TIVs.

15. The semiconductor device package of claim 13, wherein the adhesion layer comprises titanium (Ti).

16. The semiconductor device package of claim 13, wherein a second polymer layer of the one or more second polymer layers is on the adhesion layer, wherein the adhesion layer is configured to promote adhesion between the first portion of the first RDL and the second polymer layer.

17. The semiconductor device package of claim 13, further comprising:

a first seed layer on the first polymer layer, wherein the first RDL is formed on the first seed layer, and wherein the adhesion layer and the first seed layer encapsulate the first portion of the first RDL.

18. The semiconductor device package of claim 17, further comprising:

a second seed layer on a portion of the adhesion layer that is one of at least one of the first portion of the first RDL.

19. The semiconductor device package of claim 18, further comprising:

a via structure on the second seed layer.

20. The semiconductor device package of claim 17, wherein the adhesion layer and the first seed layer include a same material.

* * * * *